(12) United States Patent
Kim et al.

(10) Patent No.: US 9,601,209 B2
(45) Date of Patent: Mar. 21, 2017

(54) VOLTAGE GENERATOR AND SEMICONDUCTOR MEMORY DEVICE

(71) Applicant: SAMSUNG ELECTRONICS CO., LTD., Suwon-si, Gyeonggi-Do (KR)

(72) Inventors: Tae-Hyun Kim, Seongnam-Si (KR); Young-Sun Min, Hwaseong-Si (KR); Sung-Whan Seo, Hwaseong-Si (KR); Won-Tae Kim, Seongnam-Si (KR); Sang-Wan Nam, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/716,550

(22) Filed: May 19, 2015

(65) Prior Publication Data

US 2015/0340097 A1    Nov. 26, 2015

(30) Foreign Application Priority Data

May 21, 2014    (KR) .......................... 10-2014-0060994

(51) Int. Cl.
*G11C 29/02*    (2006.01)
*G11C 7/04*    (2006.01)
(Continued)

(52) U.S. Cl.
CPC .............. *G11C 16/26* (2013.01); *G11C 5/147* (2013.01); *G11C 7/04* (2013.01); *G11C 16/30* (2013.01); *G11C 16/349* (2013.01); *G11C 29/021* (2013.01); *G11C 29/028* (2013.01); *H02M 3/158* (2013.01)

(58) Field of Classification Search
CPC ......... G11C 16/26; G11C 7/04; G11C 16/349; G11C 29/028; G11C 29/021; G11C 16/30; G11C 5/147; H02M 3/158
See application file for complete search history.

(56) References Cited

U.S. PATENT DOCUMENTS 6,750,641 B1    6/2004    Ivanov et al.
7,399,116 B2    7/2008    Takeuchi
(Continued)

FOREIGN PATENT DOCUMENTS

JP    4655890 B2    3/2011
JP    4753966 B     6/2011
(Continued)

*Primary Examiner* — John H. Hur
(74) *Attorney, Agent, or Firm* — Volentine & Whitt, PLLC

(57) ABSTRACT

A voltage generator includes a first trim unit and a second trim unit. The first trim unit generates a first voltage variable depending on temperature variation and a second voltage invariable irrespective of the temperature variation based on a power supply voltage, and performs a first trim operation by changing a level of the second voltage. The level of the second voltage at a first temperature becomes substantially the same as a level of the first voltage at the first temperature based on the first trim operation. The second trim unit generates an output voltage based on the power supply voltage, the first and second voltages, a reference voltage and a feedback voltage, and performs a second trim operation by adjusting variation of the output voltage depending on the temperature variation based on a result of the first trim operation.

15 Claims, 19 Drawing Sheets

(51) Int. Cl.
    *G11C 16/34*     (2006.01)
    *G11C 16/26*     (2006.01)
    *G11C 16/30*     (2006.01)
    *G11C 5/14*     (2006.01)
    *H02M 3/15*     (2006.01)
    *H02M 3/158*     (2006.01)

(56) References Cited

U.S. PATENT DOCUMENTS

| | | |
|---|---|---|
| 7,543,253 B2 | 6/2009 | Marinca et al. |
| 7,859,918 B1 | 12/2010 | Nguyen et al. |
| 7,907,021 B2 | 3/2011 | Chen |
| 8,228,739 B2 | 7/2012 | Pan et al. |
| 8,576,651 B2 | 11/2013 | Scheuerlein et al. |
| 2006/0028875 A1* | 2/2006 | Avraham ............... G11C 16/12 365/185.24 |
| 2013/0147544 A1 | 6/2013 | Kim et al. |
| 2013/0222022 A1 | 8/2013 | Vyas |
| 2014/0025330 A1 | 1/2014 | Bhandari |

FOREIGN PATENT DOCUMENTS

| | | |
|---|---|---|
| KR | 1015049 B | 2/2011 |
| WO | WO 2004-034564 A3 | 4/2004 |

\* cited by examiner

VOLTAGE GENERATOR AND SEMICONDUCTOR MEMORY DEVICE

CROSS-REFERENCE TO RELATED APPLICATION

A claim for priority under 35 USC §119 is made to Korean Patent Application No. 10-2014-0060994, filed on May 21, 2014 in the Korean Intellectual Property Office (KIPO), the entire contents of which are hereby incorporated by reference.

BACKGROUND

The present inventive concept relates to semiconductor memory devices, and more particularly to voltage generators included in semiconductor memory devices, and semiconductor memory devices including voltage generators.

Semiconductor memory devices are generally classified into two categories depending upon whether they retain stored data when disconnected from power. Volatile memory devices lose stored data when disconnected from power, and nonvolatile memory devices retain stored data when disconnected from power. Memory cells included in nonvolatile memory devices may have operating characteristics that are variable depending on environmental and/or operational conditions such as an operating temperature and/or the number of program/erase operations endured, or the like. It is thus typically required to supply an operating voltage to memory cells that is variable depending on the temperature variation of the memory cells.

SUMMARY

Embodiments of the inventive concept provide a voltage generator capable of effectively controlling a level of an output voltage based on temperature variation.

Example embodiments of the inventive concept also provide a semiconductor memory device including the voltage generator.

Example embodiments of the inventive concept provide a voltage generator that includes a first trim unit and a second trim unit. The first trim unit may be configured to generate a first voltage and a second voltage based on a power supply voltage, and may be configured to perform a first trim operation by changing a level of the second voltage. The first voltage is variable depending on a temperature variation. The second voltage is invariable irrespective of the temperature variation. The level of the second voltage at a first temperature becomes substantially the same as a level of the first voltage at the first temperature based on the first trim operation. The second trim unit may be configured to generate an output voltage based on the power supply voltage, the first voltage, the second voltage, a reference voltage and a feedback voltage, and may be configured to perform a second trim operation by adjusting a variation of the output voltage depending on the temperature variation based on a result of the first trim operation. The feedback voltage is adjusted based on the output voltage.

In example embodiments, a first level of the output voltage at the first temperature may be set to a first target level when the first trim operation is completed, and a second level of the output voltage at a second temperature may be set to a second target level when the second trim operation is completed.

In example embodiments, the second level of the output voltage may be set to the second target level by fixing the first level of the output voltage as the first target level and by adjusting the variation of the output voltage depending on the temperature variation.

In example embodiments, the first trim unit may include a first voltage generation unit and a second voltage generation unit. The first voltage generation unit may be configured to generate the first voltage based on the power supply voltage and a ground voltage. The second voltage generation unit may be configured to generate the second voltage based on the power supply voltage and the ground voltage, and may be configured to change the level of the second voltage based on a first control signal.

In example embodiments, the first voltage generation unit may include a first p-type metal oxide semiconductor (PMOS) transistor, a second PMOS transistor, a third PMOS transistor and a fourth PMOS transistor. The first PMOS transistor may have a first electrode connected to the power supply voltage, a control electrode connected to the ground voltage, and a second electrode. The second PMOS transistor may have a first electrode connected to the second electrode of the first PMOS transistor, a control electrode connected to the ground voltage, and a second electrode connected to a first node. The third and fourth PMOS transistors may be connected in parallel between the first node and the ground voltage. Each of the third and fourth PMOS transistors may have a control electrode connected to the ground voltage. The first voltage may be output from the first node.

In example embodiments, the second voltage generation unit may include a first resistor and a second resistor. The first resistor may be connected between the power supply voltage and a first node. The second resistor may be connected between the first node and the ground voltage. The second voltage may be output from the first node, and at least one of a resistance of the first resistor and a resistance of the second resistor may be variable based on the first control signal.

In example embodiments, the second trim unit may include a first comparison unit, a second comparison unit, an output voltage generation unit and a feedback unit. The first comparison unit may be configured to compare the reference voltage with the feedback voltage. The second comparison unit may be configured to compare the first voltage with the second voltage. The output voltage generation unit may be connected to the first and second comparison units via first and second nodes, and may be configured to amplify a voltage at the first node to generate the output voltage. The feedback unit may receive the output voltage, and may be configured to adjust the feedback voltage based on the output voltage. The variation of the output voltage depending on the temperature variation may be adjusted by changing at least one of a first current and a second current based on a first control signal. The first current may flow through the first comparison unit. The second current may flow through the second comparison unit.

In example embodiments, the first comparison unit may include a first n-type metal oxide semiconductor (NMOS) transistor, a second NMOS transistor and a first current source. The first NMOS transistor may be connected between the first node and a third node, and may have a control electrode connected to the reference voltage. The second NMOS transistor may be connected between the second node and the third node, and may have a control electrode connected to the feedback voltage. The first current source may be connected between the third node and a ground voltage.

In example embodiments, the second comparison unit may include a third NMOS transistor, a fourth NMOS transistor and a second current source. The third NMOS transistor may be connected between the first node and a fourth node, and may have a control electrode connected to the first voltage. The fourth NMOS transistor may be connected between the second node and the fourth node, and may have a control electrode connected to the second voltage. The second current source may be connected between the fourth node and the ground voltage.

In example embodiments, the second current source may include a plurality of power switches. The plurality of power switches may be connected in parallel between the fourth node and the ground voltage. Each of the plurality of power switches may be selectively turned on in response to the first control signal.

In example embodiments, the output voltage generation unit may include a first PMOS transistor, a second PMOS transistor and an amplifier. The first PMOS transistor may be connected between the power supply voltage and the first node, and may have a control electrode connected to the second node. The second PMOS transistor may be connected between the power supply voltage and the second node, and may have a control electrode connected to the second node. The amplifier may have an input electrode connected to the first node and an output electrode providing the output voltage.

In example embodiments, the variation of the output voltage depending on the temperature variation may increase as the second current increases.

In example embodiments, the voltage generator may further include a control unit. The control unit may be configured to generate a first control signal for the first trim operation based on the first voltage and the second voltage, and may be configured to generate a second control signal for the second trim operation based on the output voltage.

In example embodiments, the control unit may include a storage unit. The storage unit may be configured to store a final value of the first control signal when the first trim operation is completed, and may be configured to store a final value of the second control signal when the second trim operation is completed.

Example embodiments of the inventive concept provide a semiconductor memory device that includes a memory cell array and a voltage generator. The memory cell array includes a plurality of memory cells, and may be configured to operate based on a memory cell operating voltage. The voltage generator may be configured to generate the memory cell operating voltage based on a power supply voltage. The voltage generator includes a first trim unit and a second trim unit. The first trim unit may be configured to generate a first voltage and a second voltage based on the power supply voltage, and may be configured to perform a first trim operation by changing a level of the second voltage. The first voltage is variable depending on a temperature variation. The second voltage is invariable irrespective of the temperature variation. The level of the second voltage at a first temperature becomes substantially the same as a level of the first voltage at the first temperature based on the first trim operation. The second trim unit may be configured to generate the memory cell operating voltage based on the power supply voltage, the first voltage, the second voltage, a reference voltage and a feedback voltage, and may be configured to perform a second trim operation by adjusting a variation of the memory cell operating voltage depending on the temperature variation based on a result of the first trim operation. The feedback voltage is adjusted based on the output voltage.

In example embodiments, the semiconductor memory device may be a nonvolatile memory device, the plurality of memory cells may be nonvolatile memory cells, and the memory cell operating voltage may correspond to a read voltage applied to the nonvolatile memory cells. A level of the read voltage may be selectively changed based on the number of program/erase operations performed on the nonvolatile memory cells.

In example embodiments, the second trim unit may receive a control signal for the second trim operation. A final value of the control signal may be stored when the second trim operation is completed. The final value of the control signal may be changed based on a lookup table when the number of the program/erase operations is greater than a reference number after the first and second trim operations are completed.

In example embodiments, the first and second trim operations may be re-performed when the number of the program/erase operations is greater than a reference number after the first and second trim operations are completed.

In example embodiments, the nonvolatile memory device may be a vertical memory device having a stacked structure.

Example embodiments of the inventive concept provide a voltage generator that includes a first trim unit and a second trim unit. The first trim unit may be configured to generate a first voltage and a second voltage based on a power supply voltage, and may be configured to perform a first trim operation by changing at least one of a level of the first voltage and a level of the second voltage. The first voltage is variable depending on a temperature variation. The second voltage is invariable irrespective of the temperature variation. The level of the second voltage at a first temperature becomes substantially the same as the level of the first voltage at the first temperature based on the first trim operation. The second trim unit may be configured to generate an output voltage based on the power supply voltage, the first voltage, the second voltage, a reference voltage and a feedback voltage, and may be configured to perform a second trim operation by adjusting a variation of the output voltage depending on the temperature variation based on a result of the first trim operation. The feedback voltage is adjusted based on the output voltage.

Example embodiments of the inventive concept provide a method of generating an operating voltage for a semiconductor memory device. The method includes generating a first voltage and a second voltage based on a power supply voltage, the first voltage being variable depending on a temperature variation and the second voltage being invariable irrespective of the temperature variation. The method further includes performing a first trim operation by changing a level of the second voltage at a first temperature to be substantially the same as a level of the first voltage at the first temperature; and generating an output voltage based on the power supply voltage, the first and second voltages, a reference voltage and a feedback voltage. The method also includes performing a second trim operation by adjusting a variation of the output voltage depending on the temperature variation based on a result of the first trim operation, to provide the operating voltage.

In example embodiments, the feedback voltage may be adjusted based on the output voltage.

In example embodiments, the semiconductor memory device may include a plurality of nonvolatile memory cells and the operating voltage may be a read voltage, and the method may further include selectively changing a level of the read voltage based on a number of program/erase operations performed on the nonvolatile memory cells.

Accordingly, the voltage generator according to example embodiments of the inventive concept may perform a two-step trim operation. The voltage generator may set the first target level of the output voltage at the first temperature based on the first trim operation, and may set the second target level of the output voltage at the second temperature based on the second trim operation by fixing the first target level of the output voltage at the first temperature and by adjusting the variation of the output voltage depending on the temperature variation. Accordingly, the voltage generator may effectively generate the output voltage that has the target level corresponding to the present operating temperature, and the semiconductor memory device including the voltage generator may have a relatively improved performance.

BRIEF DESCRIPTION OF THE DRAWINGS

Example embodiments of the inventive concept will be more clearly understood from the following detailed description taken in conjunction with the accompanying drawings.

DETAILED DESCRIPTION

Figure 1:
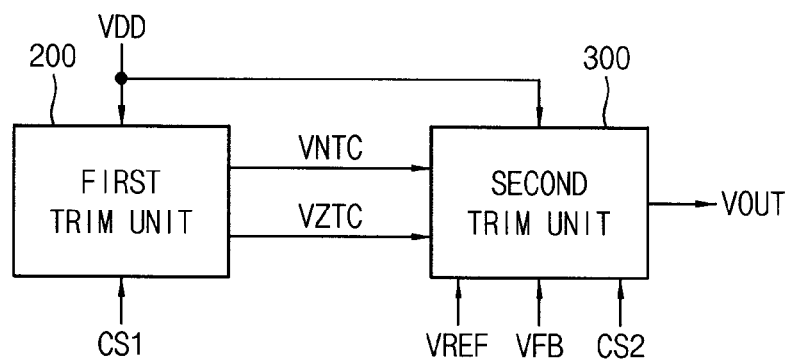
FIG. 1 is a block diagram illustrating a voltage generator according to example embodiments of the inventive concept.

Various example embodiments of the inventive concept will be described more fully with reference to the accompanying drawings. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a voltage generator according to example embodiments of the inventive concept.

Referring to FIG. 1, voltage generator 100 includes a first trim unit 200 and a second trim unit 300. The first trim unit 200 generates a first voltage VNTC and a second voltage VZTC based on a power supply voltage VDD. The first voltage VNTC is variable depending on temperature variation (e.g., variation of an operating temperature of the voltage generator 100), and the second voltage VZTC is invariable irrespective of the temperature variation. In other words, the first voltage VNTC may be a voltage with a negative temperature coefficient (e.g., VNTC), and the second voltage VZTC may be a voltage with a zero temperature coefficient (e.g., VZTC). The first trim unit 200 performs a first trim operation based on a first control signal CS1. The first trim operation may represent an operation of calibrating at least one selected from the first voltage VNTC and the second voltage VZTC. A level of the second voltage VZTC at a first temperature becomes substantially the same as a level of the first voltage VNTC at the first temperature based on the first trim operation.

In some example embodiments, as will be described below with reference to FIG. 2A, the first trim operation may be performed by changing the level of the second voltage VZTC. In other example embodiments, as will be described below with reference to FIG. 10A, the first trim operation may be performed by changing the level of the first voltage VNTC. In still other example embodiments, as will be described below with reference to FIG. 10B, the first trim operation may be performed by changing both the level of the first voltage VNTC and the level of the second voltage VZTC.

The second trim unit 300 generates an output voltage VOUT based on the power supply voltage VDD, the first voltage VNTC, the second voltage VZTC, a reference voltage VREF and a feedback voltage VFB. As will be described below with reference to FIG. 6, the feedback voltage VFB is adjusted based on the output voltage VOUT. The second trim unit 300 performs a second trim operation based on a second control signal CS2. The second trim operation may be performed after the first trim operation is completed, and may represent an operation of calibrating the output voltage VOUT. The second trim unit 300 performs the second trim operation by adjusting variation of the output voltage VOUT (e.g., a slope of the output voltage VOUT) depending on the temperature variation based on a result of the first trim operation.

Figure 2A:
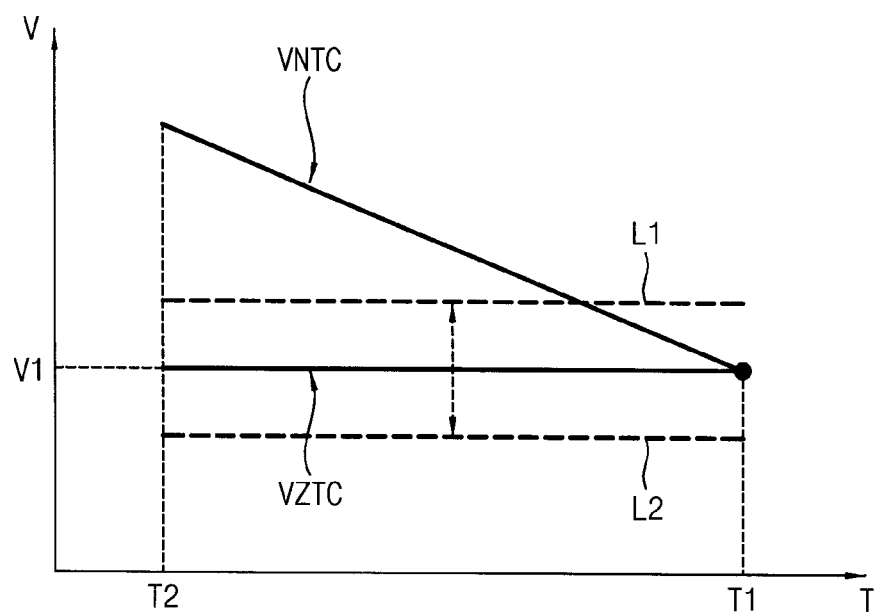
FIGS. 2A and 2B are diagrams descriptive of an operation of the voltage generator shown in FIG. 1, according to example embodiments of the inventive concept.
Figure 2B:
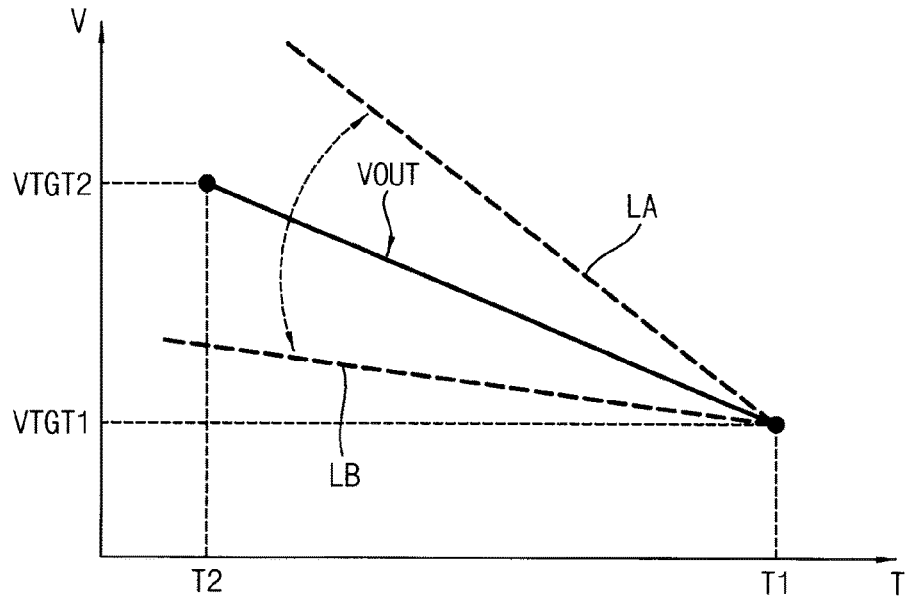

FIGS. 2A and 2B are diagrams descriptive of an operation of the voltage generator shown in FIG. 1, according to example embodiments of the inventive concept. FIG. 2A is a graph descriptive of an example of the first trim operation performed by the first trim unit 200 in FIG. 1. FIG. 2B is a graph descriptive of an example of the second trim operation performed by the second trim unit 300 in FIG. 1. In FIGS. 2A and 2B, the x-axis represents temperature T and the y-axis represents voltage V.

Referring to FIGS. 1 and 2A, the first voltage VNTC is variable depending on the temperature variation, and the second voltage VZTC is invariable irrespective of the temperature variation. For example, the first voltage VNTC may decrease as the operating temperature increases. The second voltage VZTC does not change as the temperature varies.

To match the level of the second voltage VZTC at a first temperature T1 to the level of the first voltage VNTC at the first temperature T1, the first trim operation may be performed based on the first control signal CS1. As illustrated in FIG. 2A, the first trim operation may be performed by changing the level of the second voltage VZTC. For example, the level of the second voltage VZTC may be increased or decreased between a dotted line L1 and a dotted line L2 during the first trim operation. In FIG. 2A, since the first voltage VNTC has a first level V1 at the first temperature T1, the first trim operation may be completed when the level of the second voltage VZTC is set to the first level V1. As will be described below with reference to FIG. 2B, a first level of the output voltage VOUT at the first temperature T1 may be set to a first target level VTGT1 when the first trim operation is completed.

Referring to FIGS. 1 and 2B, to set a second level of the output voltage VOUT at a second temperature T2 to a second target level VTGT2, the second trim operation may be performed based on the second control signal CS2 and a result of the first trim operation, after the first trim operation is completed. As illustrated in FIG. 2B, the second trim operation may be performed by adjusting the variation (e.g., the slope) of the output voltage VOUT depending on the temperature variation. For example, the variation (e.g., the slope) of the output voltage VOUT may be increased or decreased between a dotted line LA and a dotted line LB. For example, the second trim operation may be performed by fixing the first level of the output voltage VOUT as the first target level VTGT1 and by adjusting the variation (e.g., the slope) of the output voltage VOUT. The second level of the output voltage VOUT at the second temperature T2 may be set to the second target level VTGT2 when the second trim operation is completed.

The voltage generator 100 according to example embodiments may perform a two-step trim (e.g., calibration) operation. For example, the voltage generator 100 may perform the first trim operation at the first temperature T1 and may perform the second trim operation at the second temperature T2. The first target level VTGT1 of the output voltage VOUT at the first temperature T1 may be obtained based on the first trim operation, and then the second target level VTGT2 of the output voltage VOUT at the second temperature T2 may be obtained based on the second trim operation and the first target level VTGT1. Accordingly, the number of operations for calibrating the output voltage VOUT may be reduced, and the voltage generator 100 may effectively generate the output voltage VOUT that has a target level corresponding to a present operating temperature with relatively minimized trial and error.

Figure 3:
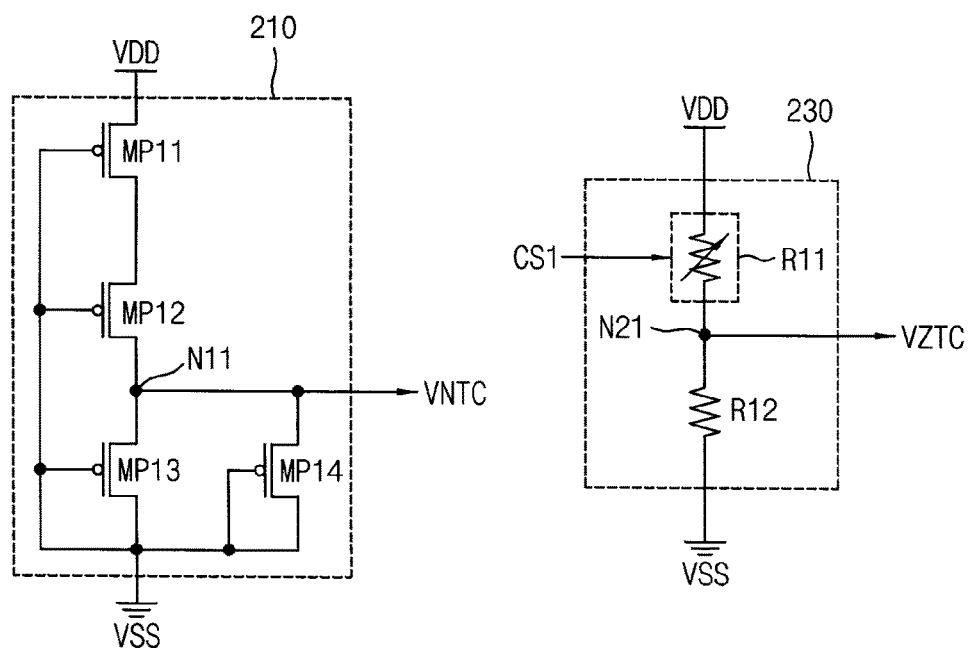
FIG. 3 is a circuit diagram illustrating an example of a first trim unit included in the voltage generator shown in FIG. 1, according to example embodiments of the inventive concept.

FIG. 3 is a circuit diagram illustrating an example of a first trim unit included in the voltage generator shown in FIG. 1, according to example embodiments of the inventive concept.

Referring to FIG. 3, first trim unit 200 may include a first voltage generation unit 210 and a second voltage generation unit 230. The first voltage generation unit 210 may generate the first voltage VNTC based on the power supply voltage VDD and a ground voltage VSS.

The first voltage generation unit 210 may include a first p-type metal oxide semiconductor (PMOS) transistor MP11, a second PMOS transistor MP12, a third PMOS transistor MP13 and a fourth PMOS transistor MP14. The first PMOS transistor MP11 may have a first electrode connected to the power supply voltage VDD, a control electrode connected to the ground voltage VSS, and a second electrode. The second PMOS transistor MP12 may have a first electrode connected to the second electrode of the first PMOS transistor MP11, a control electrode connected to the ground voltage VSS, and a second electrode connected to a first node N11. The third and fourth PMOS transistors MP13 and MP14 may be connected in parallel between the first node N11 and the ground voltage VSS, each having a first electrode connected to the first node N11 and a second electrode connected to the ground voltage VSS. Each of the third and fourth PMOS transistors MP13 and MP14 may have a control electrode connected to the ground voltage VSS. The control electrodes of the first through fourth PMOS transistors MP11, MP12, MP13 and MP14 may be commonly connected to the ground voltage VSS. The first voltage VNTC may be output from the first node N11.

When the voltage generator 100 of FIG. 1 operates at a relatively low temperature, threshold voltages of the PMOS transistors MP11, MP12, MP13 and MP14 may increase, a current flowing through the first voltage generation unit 210 may decrease, and thus the first voltage VNTC may increase. When the voltage generator 100 of FIG. 1 operates at a relatively high temperature, the threshold voltages of the PMOS transistors MP11, MP12, MP13 and MP14 may decrease, the current flowing through the first voltage generation unit 210 may increase, and thus the first voltage VNTC may decrease. Accordingly, as illustrated in FIG. 2A, the first voltage VNTC may decrease as the operating temperature increases.

The second voltage generation unit 230 may generate the second voltage VZTC based on the power supply voltage VDD and the ground voltage VSS, and may change the level of the second voltage VZTC based on the first control signal CS1. The first and second voltage generation units 210 and 230 may operate based on the same power (e.g., the same power supply voltage VDD).

The second voltage generation unit 230 may include a first resistor R11 and a second resistor R12. The first resistor R11 may be connected between the power supply voltage VDD and a second node N21. The second resistor R12 may be connected between the second node N21 and the ground voltage VSS. The second voltage VZTC may be output from the second node N21. A resistance of the first resistor R11 may be variable based on the first control signal CS1. In other words, the first resistor R11 may be an adjustable resistor or a variable resistor.

Figure 4:
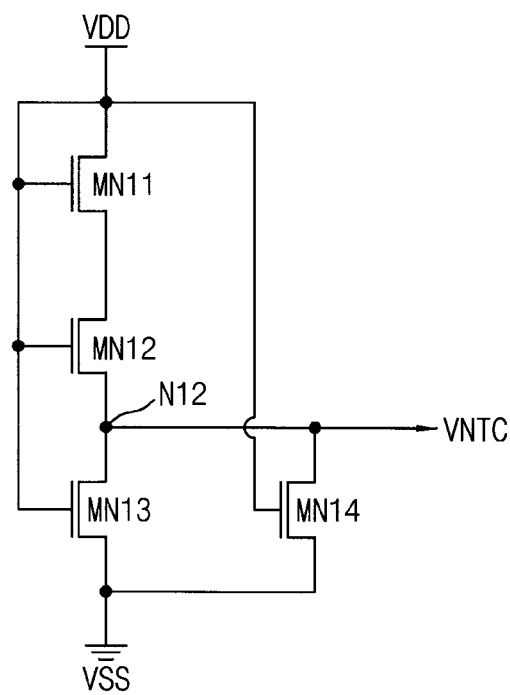
FIG. 4 is a circuit diagram illustrating another example of a first voltage generation unit included in the first trim unit shown in FIG. 3, according to example embodiments of the inventive concept.

FIG. 4 is a circuit diagram illustrating another example of a first voltage generation unit included in the first trim unit shown in FIG. 3, according to example embodiments of the inventive concept.

Referring to FIG. 4, first voltage generation unit 210a may include a first n-type metal oxide semiconductor (NMOS) transistor MN11, a second NMOS transistor MN12, a third NMOS transistor MN13 and a fourth NMOS transistor MN14. The first NMOS transistor MN11 may have a first electrode connected to the power supply voltage VDD, a control electrode connected to the power supply voltage VDD, and a second electrode. The second NMOS transistor MN12 may have a first electrode connected to the second electrode of the first NMOS transistor MN11, a control electrode connected to the power supply voltage VDD, and a second electrode connected to a first node N12. The third and fourth NMOS transistors MN13 and MN14 may be connected in parallel between the first node N12 and the ground voltage VSS, each having a first electrode connected to the first node N12 and a second electrode connected to the ground voltage VSS. Each of the third and fourth NMOS transistors MN13 and MN14 may have a control electrode connected to the power supply voltage VDD. The control electrodes of the first through fourth NMOS transistors MN11, MN12, MN13 and MN14 may be commonly connected to the power supply voltage VDD. The first voltage VNTC may be output from the first node N12.

Figure 5A:
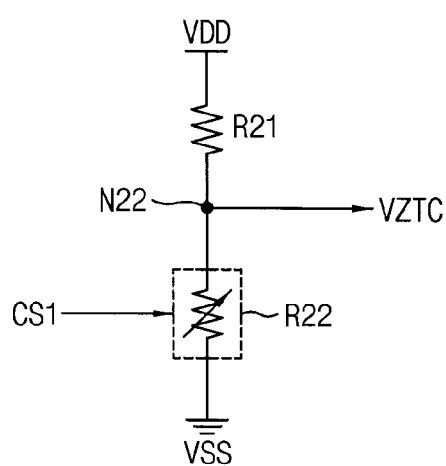
FIGS. 5A and 5B are circuit diagrams illustrating other examples of a second voltage generation unit included in the first trim unit shown in FIG. 3, according to example embodiments of the inventive concept.
Figure 5B:
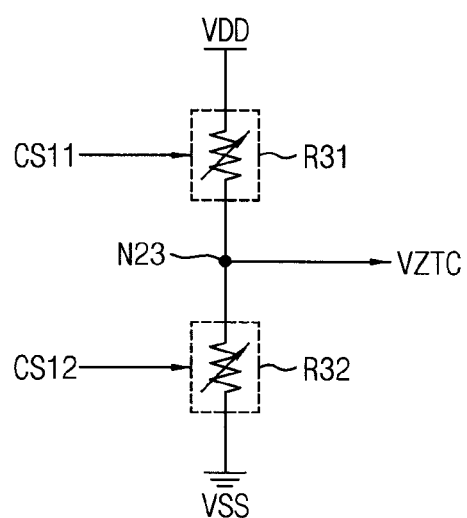

FIGS. 5A and 5B are circuit diagrams illustrating other examples of a second voltage generation unit included in the first trim unit shown in FIG. 3, according to example embodiments of the inventive concept.

Referring to FIG. 5A, second voltage generation unit 230a may include a first resistor R21 and a second resistor R22. The first resistor R21 may be connected between the power supply voltage VDD and a second node N22. The second resistor R22 may be connected between the second node N22 and the ground voltage VSS. The second voltage VZTC may be output from the second node N22. A resistance of the second resistor R22 may be variable based on the first control signal CS1. In other words, the second resistor R22 may be an adjustable resistor or a variable resistor.

Referring to FIG. 5B, second voltage generation unit 230b may include a first resistor R31 and a second resistor R32. The first resistor R31 may be connected between the power supply voltage VDD and a second node N23. The second resistor R32 may be connected between the second node N23 and the ground voltage VSS. The second voltage VZTC may be output from the second node N23. Resistances of the first and second resistors R31 and R32 may be variable based on control signals CS11 and CS12, respectively. The control signals CS11 and CS12 may be included in the first control signal CS1. In other words, each of the first and second resistors R31 and R32 may be an adjustable resistor or a variable resistor.

The first trim unit, which is included in the voltage generator according to example embodiments and has a configuration described above with reference to FIGS. 3, 4, 5A and 5B, may perform the first trim operation based on the graph of FIG. 2A. For example, each of the first voltage generation units 210 and 210a may generate the first voltage VNTC that is variable depending on the temperature variation. Each of the second voltage generation units 230, 230a and 230b may include two resistors that are connected in series between the power supply voltage VDD and the ground voltage VSS, and may generate the second voltage VZTC that is invariable irrespective of the temperature variation. At least one selected from resistances of the two resistors may be variable based on the first control signal CS1, and thus each of the second voltage generation units 230, 230a and 230b may change the level of the second voltage VZTC based on the first control signal CS1. Accordingly, the level of the second voltage VZTC at the first temperature T1 may become substantially the same as the level of the first voltage VNTC at the first temperature T1 when the first trim operation is completed.

Figure 6:
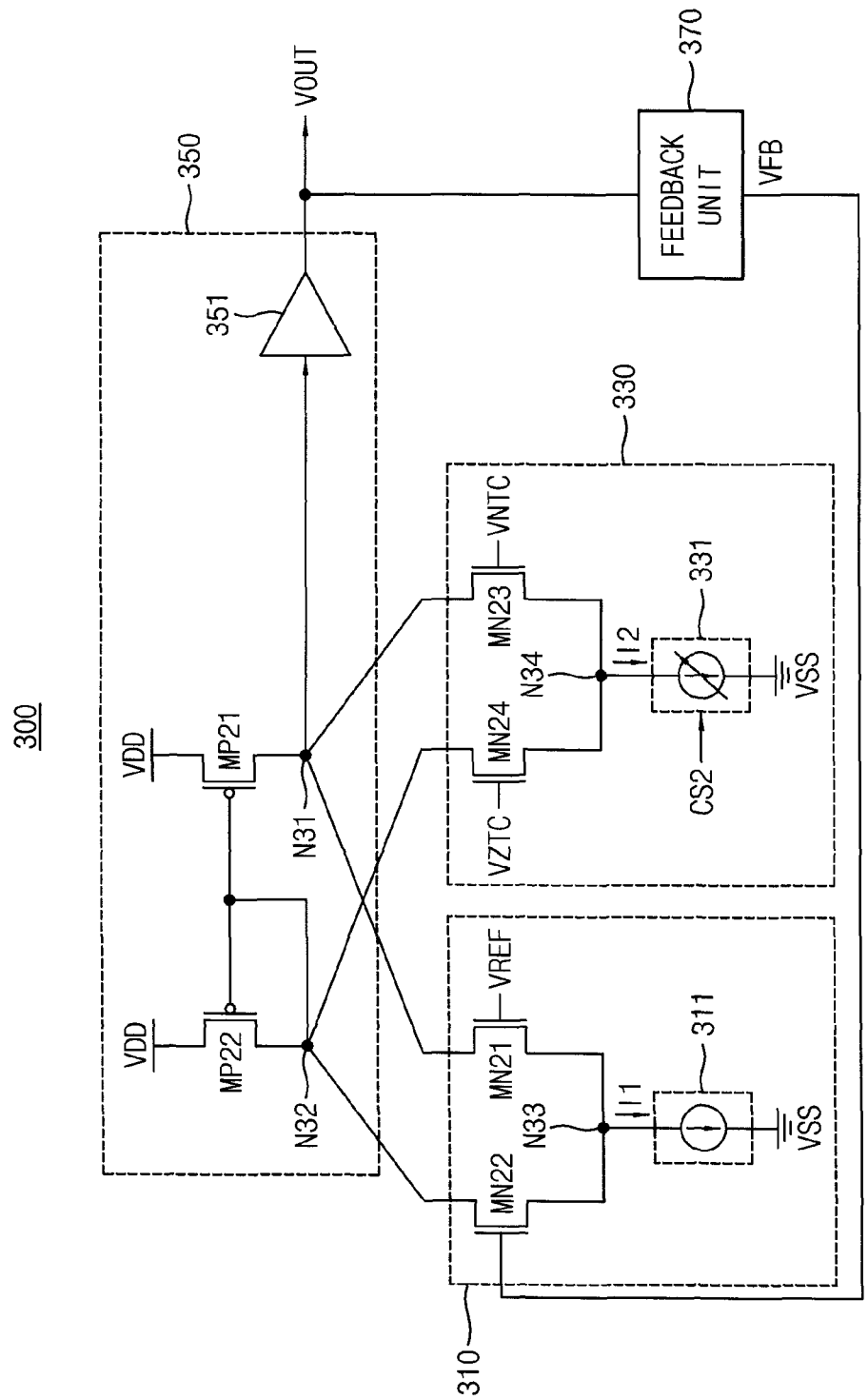
FIG. 6 is a diagram illustrating an example of a second trim unit included in the voltage generator shown in FIG. 1, according to example embodiments of the inventive concept.

FIG. 6 is a diagram illustrating an example of a second trim unit included in the voltage generator shown in FIG. 1, according to example embodiments of the inventive concept.

Referring to FIG. 6, second trim unit 300 may include a first comparison unit 310, a second comparison unit 330, an output voltage generation unit 350 and a feedback unit 370. The first comparison unit 310 may compare the reference voltage VREF with the feedback voltage VFB. A first current I1 may flow through the first comparison unit 310. The second comparison unit 330 may compare the first voltage VNTC with the second voltage VZTC. A second current I2 may flow through the second comparison unit 330. The output voltage generation unit 350 may be connected to the first and second comparison units 310 and 330 via first and second nodes N31 and N32, and may amplify a voltage at the first node N31 to generate the output voltage VOUT. The feedback unit 370 may receive the output voltage VOUT and may adjust the feedback voltage VFB based on the output voltage VOUT.

The first comparison unit 310 may include a first NMOS transistor MN21, a second NMOS transistor MN22 and a first current source 311. The first NMOS transistor MN21 may be connected between the first node N31 and a third node N33, and may have a control electrode connected to the reference voltage VREF. The second NMOS transistor MN22 may be connected between the second node N32 and the third node N33, and may have a control electrode connected to the feedback voltage VFB. The first current source 311 may be connected between the third node N33 and the ground voltage VSS.

The second comparison unit 330 may include a third NMOS transistor MN23, a fourth NMOS transistor MN24 and a second current source 331. The third NMOS transistor MN23 may be connected between the first node N31 and a fourth node N34, and may have a control electrode connected to the first voltage VNTC. The fourth NMOS transistor MN24 may be connected between the second node N32 and the fourth node N34, and may have a control electrode connected to the second voltage VZTC. The second current source 331 may be connected between the fourth node N34 and the ground voltage VSS.

The output voltage generation unit 350 may include a first PMOS transistor MP21, a second PMOS transistor MP22 and an amplifier 351. The first PMOS transistor MP21 may be connected between the power supply voltage VDD and the first node N31, and may have a control electrode connected to the second node N32. The second PMOS transistor MP22 may be connected between the power supply voltage VDD and the second node N32, and may have a control electrode connected to the second node N32. The amplifier 351 may have an input electrode connected to the first node N31 and an output electrode providing the output voltage VOUT.

In some example embodiments, the variation (e.g., the slope) of the output voltage VOUT depending on the temperature variation may be adjusted by changing the second current I2 flowing through the second comparison unit 330 based on the second control signal CS2. In other words, the second current source 331 included in the second comparison unit 330 may be an adjustable current source or a variable current source.

For example, the output voltage VOUT may be generated based on Equation 1.

$$VOUT = \left(VREF + (VZTC - VNTC)\sqrt{\frac{W2 \cdot I2}{W1 \cdot I1}}\right) / \beta \quad \text{[Equation 1]}$$

In the Equation 1, W1 represents a channel width of the transistors MN21 and MN22 included in the first comparison unit 310, W2 represents a channel width of the transistors MN23 and MN24 included in the second comparison unit 330, and β represents a feedback gain of the feedback unit 370. Thus, the variation (e.g., the slope) of the output voltage VOUT depending on the temperature variation may be adjusted by changing at least one selected from the first current I1 and the second current I2. For example, the variation of the output voltage VOUT depending on the temperature variation may increase as the second current I2 increases.

Figure 7:
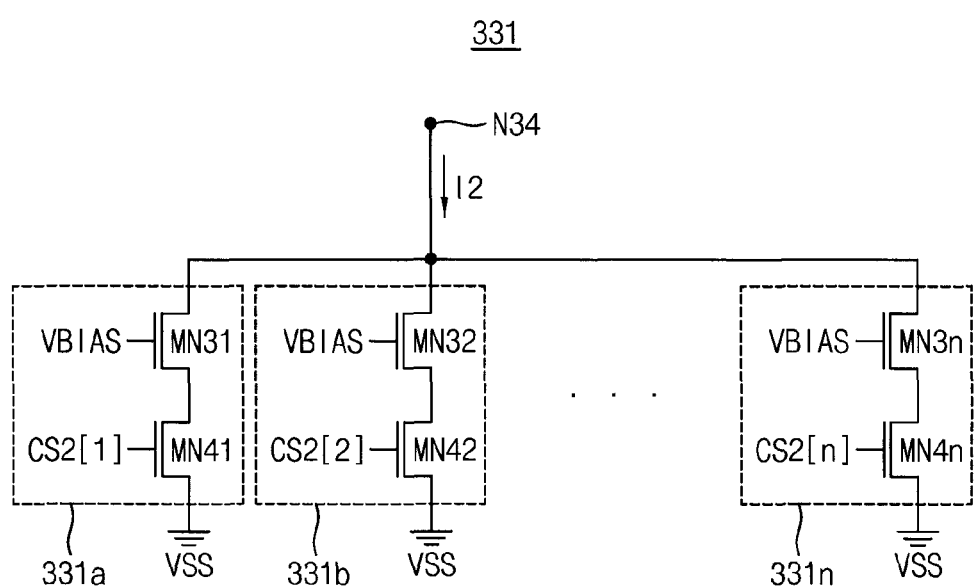
FIG. 7 is a circuit diagram illustrating an example of a second current source included in the second trim unit shown in FIG. 6, according to example embodiments of the inventive concept.

FIG. 7 is a circuit diagram illustrating an example of a second current source included in the second trim unit shown in FIG. 6, according to example embodiments of the inventive concept.

Referring to FIG. 7, second current source 331 may include a plurality of power switches 331a, 331b, ..., 331n. The plurality of power switches 331a, ..., 331n may be connected in parallel between the fourth node N34 and the ground voltage VSS. Each of the plurality of power switches 331a, ..., 331n may be selectively turned on in response to the second control signal CS2. The amount of the second current I2 may be determined based on the number of turned-on power switches among the plurality of power switches 331a, ..., 331n.

Each of the plurality of power switches 331a, ..., 331n may include two NMOS transistors that are connected in series between the fourth node N34 and the ground voltage VSS. For example, the first power switch 331a may include NMOS transistors MN31 and MN41, the second power switch 331b may include NMOS transistors MN32 and MN42, and the n-th power switch 331n, where n is a natural number, may include NMOS transistors MN3n and MN4n. Each of the NMOS transistors MN31, MN32, ..., MN3n may include a control electrode connected to a bias voltage VBIAS. Each of the NMOS transistors MN41, MN42, ..., MN4n may include a control electrode connected to a respective one of bits CS2[1], CS2[2], ..., CS4[n] of the second control signal CS2.

Figure 8:
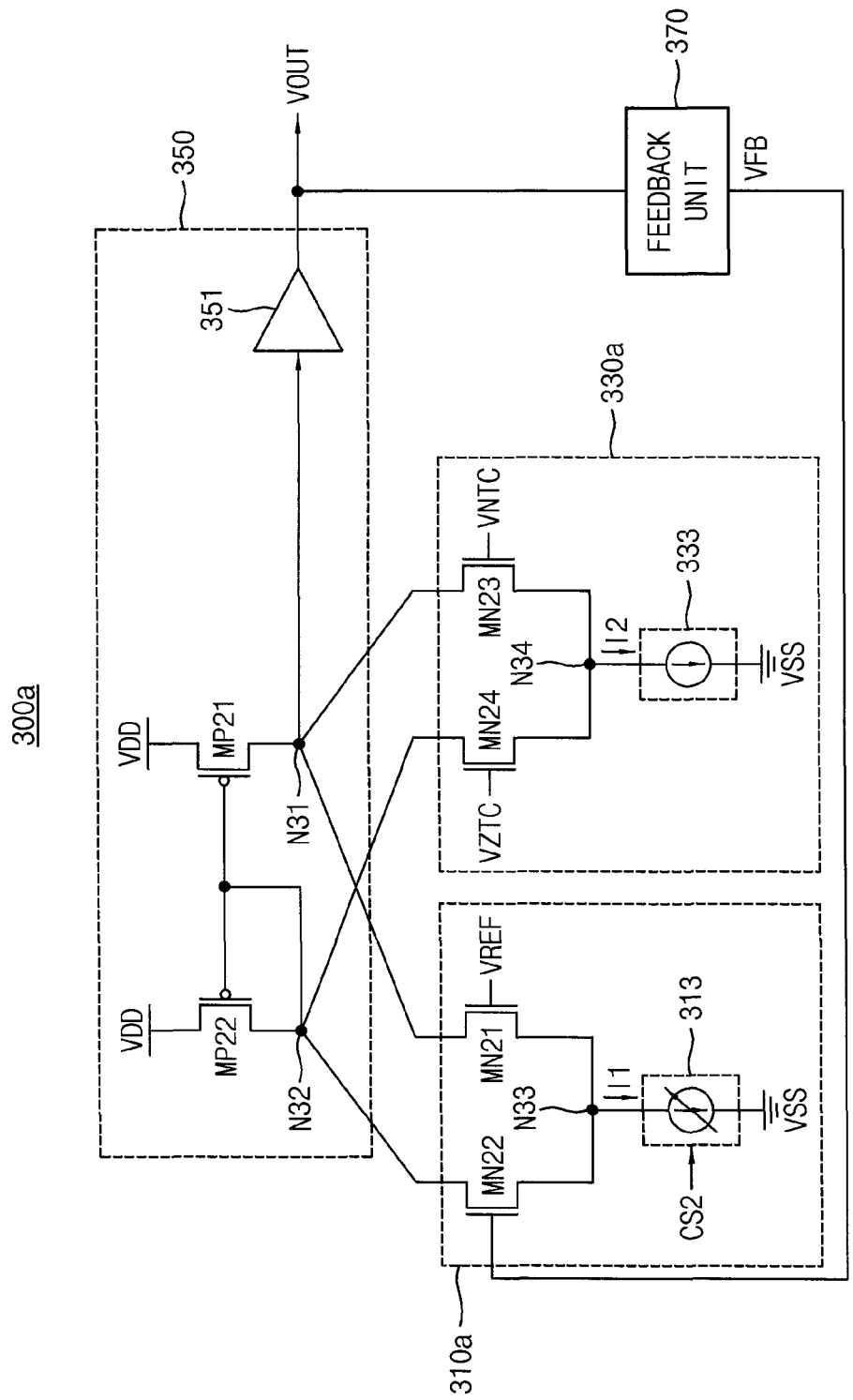
FIGS. 8 and 9 are diagrams illustrating other examples of the second trim unit included in the voltage generator shown in FIG. 1, according to example embodiments of the inventive concept.
Figure 9:
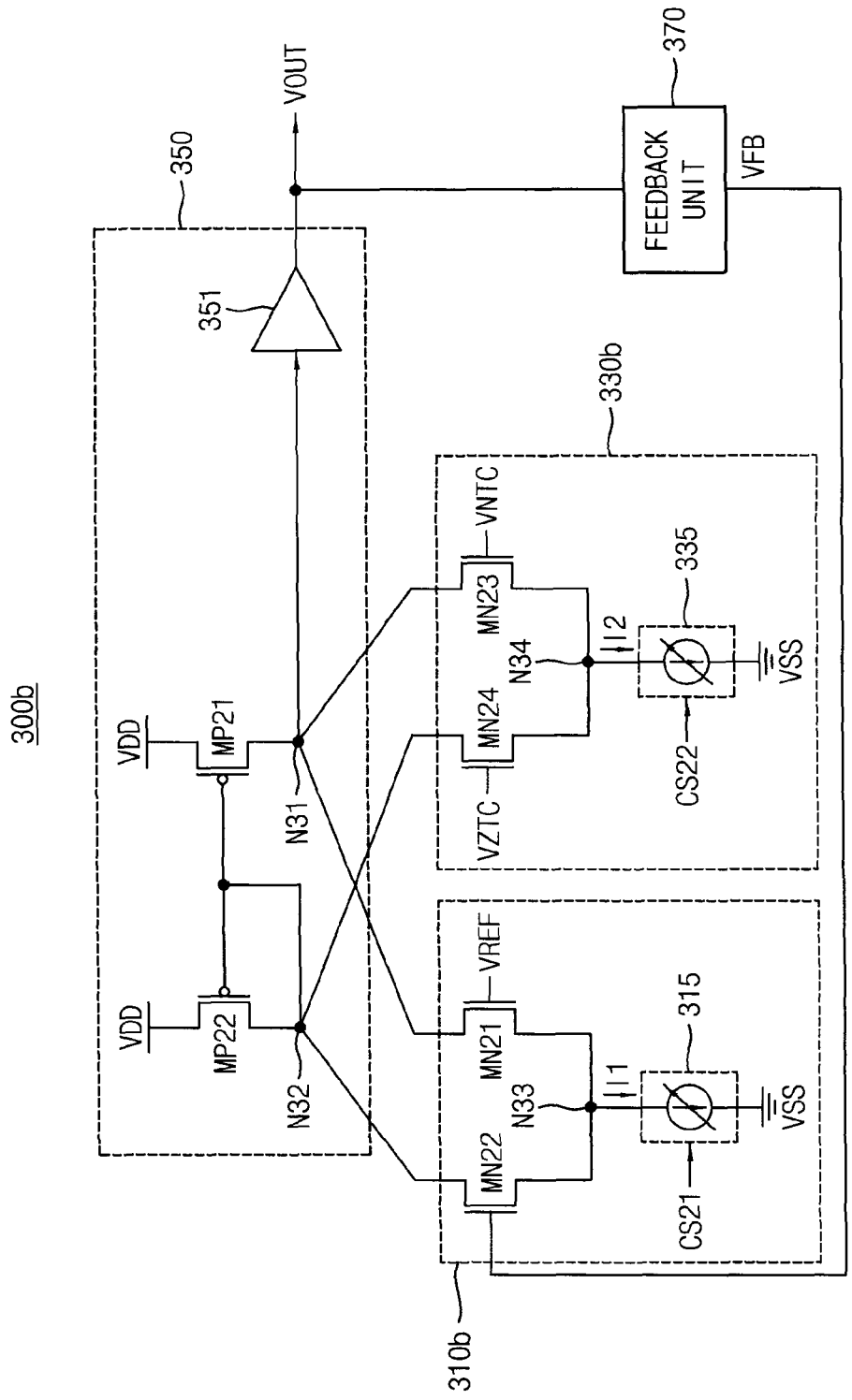

FIGS. 8 and 9 are diagrams illustrating other examples of the second trim unit included in the voltage generator shown in FIG. 1, according to example embodiments of the inventive concept.

Referring to FIG. 8, second trim unit 300a may include a first comparison unit 310a, a second comparison unit 330a, an output voltage generation unit 350 and a feedback unit 370. The first comparison unit 310a in FIG. 8 may be substantially the same as the first comparison unit 310 in FIG. 6, except that the first current source 311 in FIG. 6 is replaced with a first current source 313 in FIG. 8. The second comparison unit 330a in FIG. 8 may be substantially the same as the second comparison unit 330 in FIG. 6, except that the second current source 331 in FIG. 6 is replaced with a second current source 333 in FIG. 8. The output voltage generation unit 350 and the feedback unit 370 in FIG. 8 may be substantially the same as the output voltage generation unit 350 and the feedback unit 370 in FIG. 6, respectively.

The first current source 313 in FIG. 8 may be connected between the third node N33 and the ground voltage VSS. The second current source 333 in FIG. 8 may be connected between the fourth node N34 and the ground voltage VSS.

In some example embodiments, the variation (e.g., the slope) of the output voltage VOUT depending on the temperature variation may be adjusted by changing the first current I1 flowing through the first comparison unit 310a based on the second control signal CS2. In other words, the first current source 313 included in the first comparison unit 310a may be an adjustable current source or a variable current source. For example, the first current source 313 may have a configuration that is similar to the second current source 331 illustrated in FIG. 7. For example, the variation of the output voltage VOUT depending on the temperature variation may decrease as the first current I1 increases.

Referring to FIG. 9, second trim unit 300b may include a first comparison unit 310b, a second comparison unit 330b, an output voltage generation unit 350 and a feedback unit 370. The first comparison unit 310b in FIG. 9 may be substantially the same as the first comparison unit 310 in FIG. 6, except that the first current source 311 in FIG. 6 is replaced with a first current source 315 in FIG. 9. The second comparison unit 330b in FIG. 9 may be substantially the same as the second comparison unit 330 in FIG. 6, except that the second current source 331 in FIG. 6 is replaced with a second current source 335 in FIG. 9. The output voltage generation unit 350 and the feedback unit 370 in FIG. 9 may be substantially the same as the output voltage generation unit 350 and the feedback unit 370 in FIG. 6, respectively.

The first current source 315 in FIG. 9 may be connected between the third node N33 and the ground voltage VSS. The second current source 335 in FIG. 9 may be connected between the fourth node N34 and the ground voltage VSS.

In some example embodiments, the variation (e.g., the slope) of the output voltage VOUT depending on the temperature variation may be adjusted by changing the first current I1 flowing through the first comparison unit 310b, and by changing the second current I2 flowing through the second comparison unit 330b based on control signals CS21 and CS22, respectively. The control signals CS21 and CS22 may be included in the second control signal CS2. In other words, each of the first current source 315 included in the first comparison unit 310b and the second current source 335 included in the second comparison unit 330b may be an adjustable current source or a variable current source. For example, each of the first current source 315 and the second current source 335 may have a configuration that is similar to the second current source 331 illustrated in FIG. 7.

The second trim unit, which is included in the voltage generator according to example embodiments and has a configuration described above with reference to FIGS. 6, 7, 8 and 9, may perform the second trim operation based on the graph shown in FIG. 2B. For example, each of the second trim units 300, 300a and 300b may change at least one selected from the first current I1 and the second current I2 based on the second control signal CS2, and may set the second level of the output voltage VOUT at the second temperature T2 by fixing the first level of the output voltage VOUT as the first target level VTGT1 and by adjusting the variation (e.g., the slope) of the output voltage VOUT. Accordingly, the second level of the output voltage VOUT at the second temperature T2 may become the second target level VTGT2 when the second trim operation is completed.

Figure 10A:
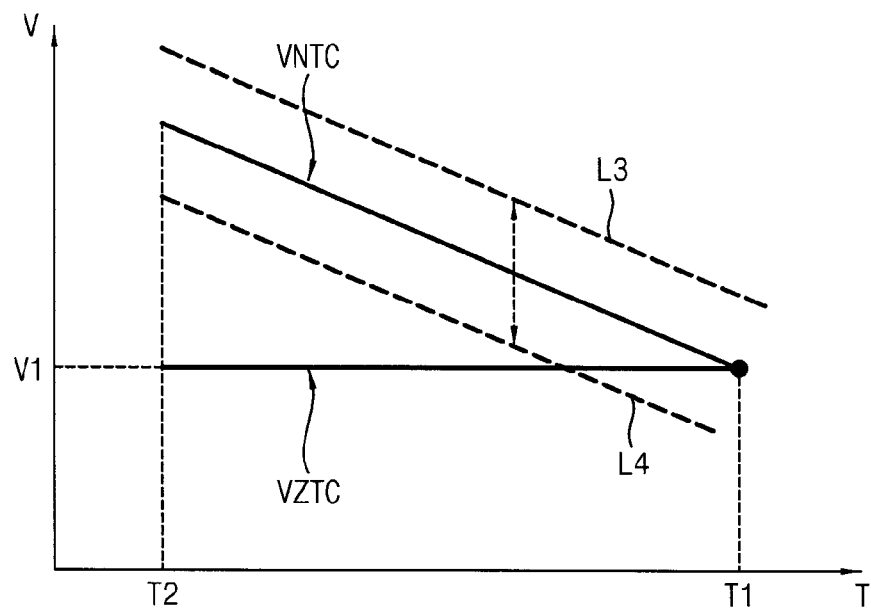
FIGS. 10A and 10B are diagrams descriptive of an operation of the voltage generator shown in FIG. 1, according to example embodiments of the inventive concept.
Figure 10B:
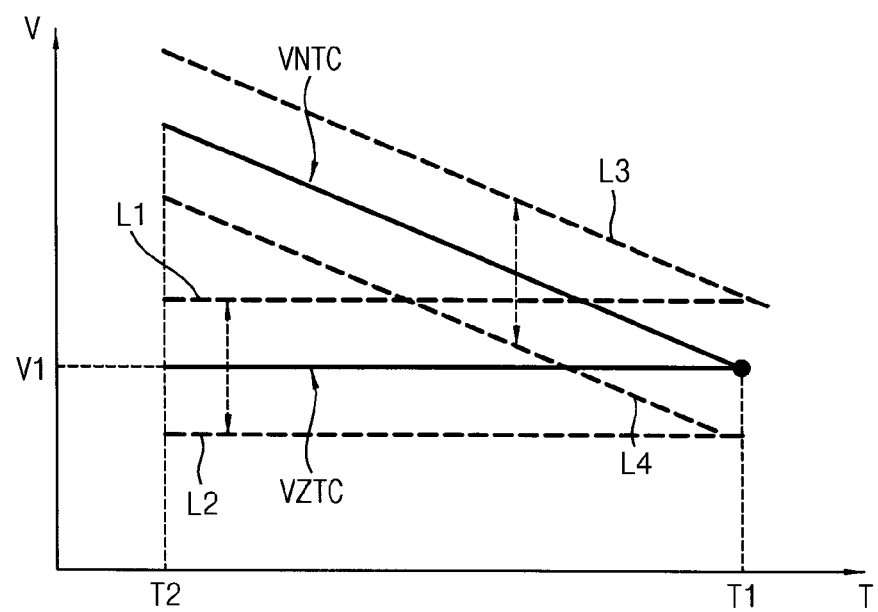

FIGS. 10A and 10B are diagrams descriptive of an operation of the voltage generator shown in FIG. 1, according to example embodiments of the inventive concept. FIGS. 10A and 10B are graphs descriptive of other examples of the first trim operation performed by the first trim unit 200 in FIG. 1.

Referring to FIGS. 1 and 10A, to match the level of the second voltage VZTC at the first temperature T1 to the level of the first voltage VNTC at the first temperature T1, the first trim operation may be performed based on the first control signal CS1. As illustrated in FIG. 10A, the first trim operation may be performed by changing the level of the first voltage VNTC. For example, the level of the first voltage VNTC may be increased or decreased between a dotted line L3 and a dotted line L4.

Referring to FIGS. 1 and 10B, to match the level of the second voltage VZTC at the first temperature T1 to the level of the first voltage VNTC at the first temperature T1, the first trim operation may be performed based on the first control signal CS1. As illustrated in FIG. 10B, the first trim operation may be performed by changing the level of the first voltage VNTC and the level of the second voltage VZTC. For example, the level of the second voltage VZTC may be increased or decreased between the dotted line L1 and the dotted line L2, and the level of the first voltage VNTC may be increased or decreased between the dotted line L3 and the dotted line L4.

Figure 11:
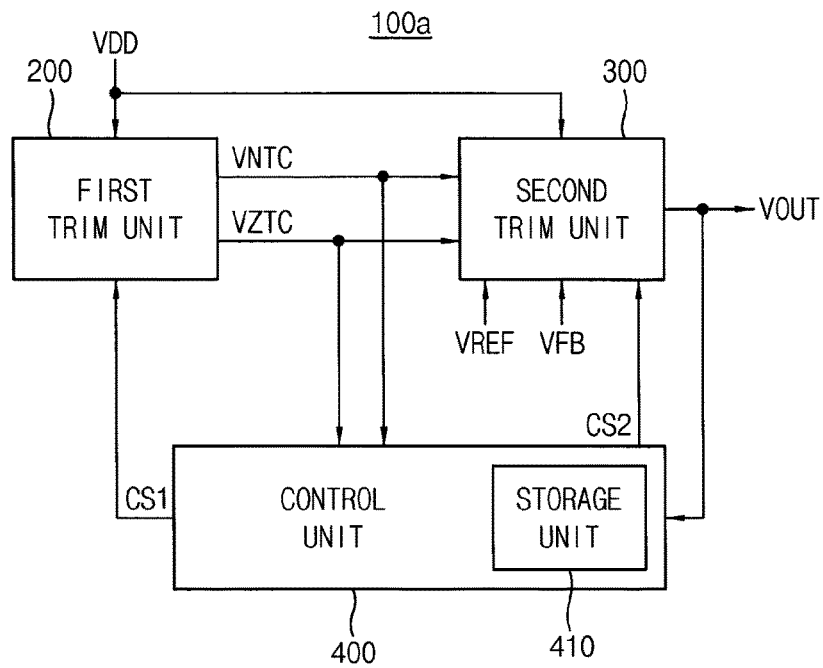
FIG. 11 is a block diagram illustrating a voltage generator according to example embodiments of the inventive concept.

According to example embodiments, a first trim unit for performing the first trim operation based on the graph of FIG. 10A or the graph of FIG. 10B may have a configuration that is different from the configuration described above with reference to FIGS. 3, 4, 5A and 5B. FIG. 11 is a block diagram illustrating a voltage generator according to example embodiments of the inventive concept.

Referring to FIG. 11, voltage generator 100a includes a first trim unit 200 and a second trim unit 300. The voltage generator 100a may further include a control unit 400. The first trim unit 200 and the second trim unit 300 in FIG. 11 may be substantially the same as the first trim unit 200 and the second trim unit 300 in FIG. 1, respectively.

The control unit 400 may generate the first control signal CS1 based on the first voltage VNTC and the second voltage VZTC, and may generate the second control signal CS2 based on the output voltage VOUT. The first trim unit 200 may perform the first trim operation based on the first control signal CS1. The second trim unit 300 may perform the second trim operation based on the second control signal CS2. The level of the second voltage VZTC at the first temperature T1 may become substantially the same as the level of the first voltage VNTC at the first temperature T1, and the level of the output voltage VOUT at the first temperature T1 may be set to the first target level VTGT1 based on the first trim operation. The level of the output voltage VOUT at the second temperature T2 may be set to the second target level VTGT2 based on the second trim operation.

In some example embodiments, the control unit 400 may include a storage unit 410. The storage unit 410 may store a final value of the first control signal CS1 when the first trim operation is completed and may store a final value of the second control signal CS2 when the second trim operation is completed. After the first and second trim operations are completed, the voltage generator 100a may generate the output voltage VOUT that has the target level corresponding to the present operating temperature based on the final value of the first control signal CS1 and the final value of the second control signal CS2.

Figure 12:
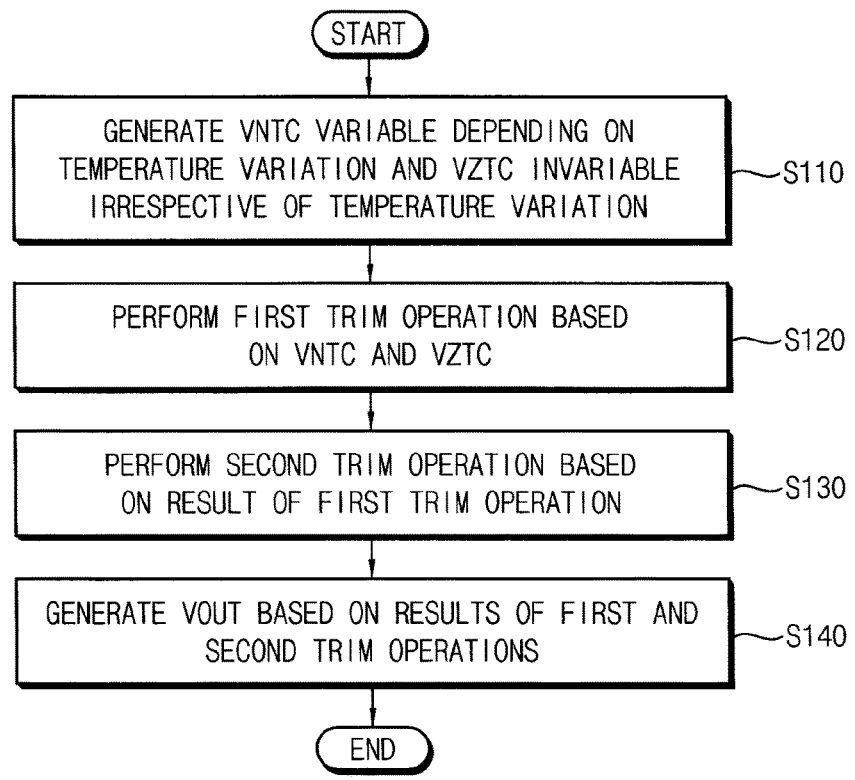
FIG. 12 is a flow chart illustrating a method of generating an output voltage according to example embodiments of the inventive concept.

FIG. 12 is a flow chart illustrating a method of generating an output voltage according to example embodiments of the inventive concept.

Referring to FIGS. 1 and 12, in the method of generating the output voltage VOUT according to example embodiments, a first voltage VNTC and a second voltage VZTC are generated based on a power supply voltage VDD (step S110). The first voltage VNTC is variable depending on temperature variation, and the second voltage VZTC is invariable irrespective of the temperature variation.

A first trim operation is performed based on the first voltage VNTC and the second voltage VZTC (step S120).

The first trim operation may represent an operation of calibrating at least one selected from the first voltage VNTC and the second voltage VZTC. A level of the second voltage VZTC at a first temperature becomes substantially the same as a level of the first voltage VNTC at the first temperature based on the first trim operation. The first trim operation may be performed based on a first control signal CS1.

A second trim operation is performed based on a result of the first trim operation (step S130). The second trim operation may represent an operation of calibrating the output voltage VOUT. Variation of the output voltage VOUT (e.g., a slope of the output voltage VOUT) depending on the temperature variation may be adjusted based on the second trim operation.

The output voltage VOUT is generated based on results of the first and second trim operations (step S140). For example, the output voltage VOUT may be generated based on the power supply voltage VDD, the first voltage VNTC, the second voltage VZTC, a reference voltage VREF, a feedback voltage VFB, the first control signal CS1 and the second control signal CS2. A final value of the first control signal CS1 and a final value of the second control signal CS2 may be provided after the first and second trim operations are completed. The output voltage VOUT that is generated based on the final values of the first and second control signals CS1 and CS2 may be set to a first target level VTGT1 at a first temperature T1, and may have a second target level VTGT2 at a second temperature T2. Accordingly, the output voltage VOUT may have a target level corresponding to a present operating temperature.

Figure 13A:
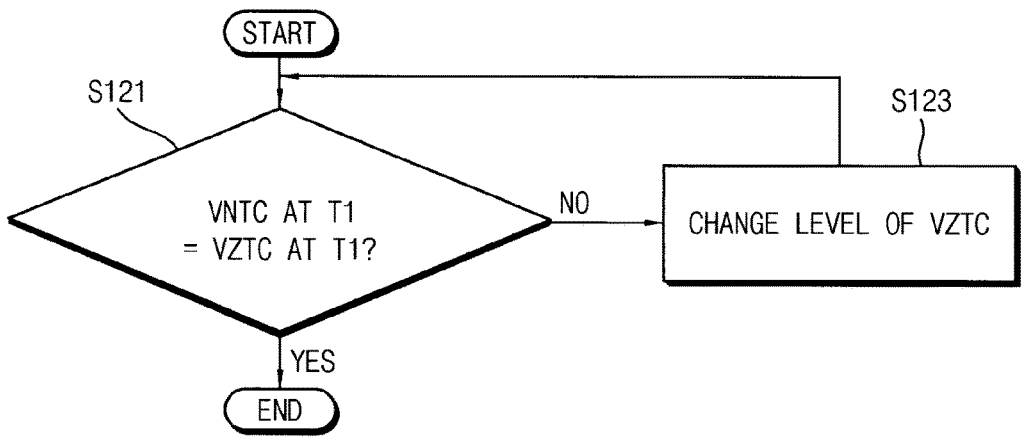
FIGS. 13A and 13B are flow charts illustrating examples of performing a first trim operation in FIG. 12, according to example embodiments of the inventive concept.
Figure 13B:
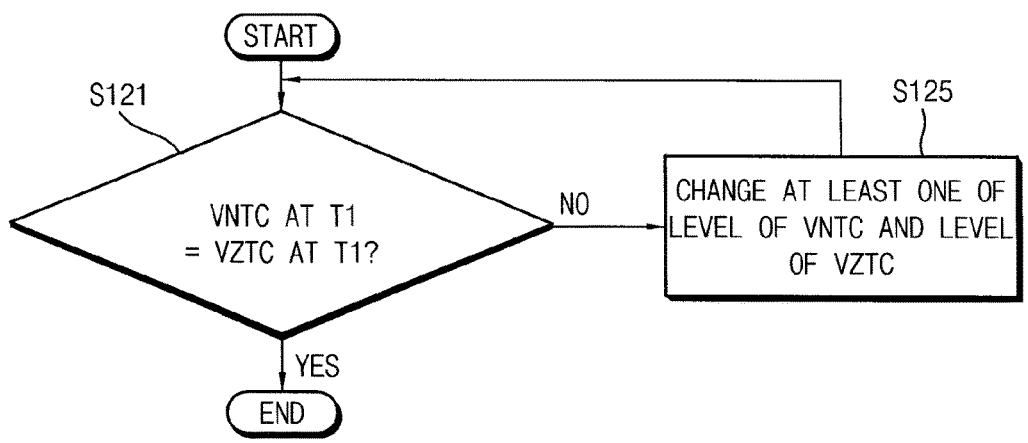

FIGS. 13A and 13B are flow charts illustrating examples of performing a first trim operation (S120) shown in FIG. 12, according to example embodiments of the inventive concept.

Referring to FIG. 13A, it may be determined whether the level of the second voltage VZTC at the first temperature T1 is substantially the same as the level of the first voltage VNTC at the first temperature T1 (step S121). When the level of the second voltage VZTC at the first temperature T1 is different from the level of the first voltage VNTC at the first temperature T1 (step S121: NO), the level of the second voltage VZTC may be changed (step S123), and then the step S121 may be repeated. When the level of the second voltage VZTC at the first temperature T1 is substantially the same as the level of the first voltage VNTC at the first temperature T1 (step S121: YES), the first trim operation may be completed. In some example embodiments, the final value of the first control signal CS1 may be stored after the first trim operation is completed. The example of FIG. 13A may be employed to perform the first trim operation based on the graph of FIG. 2A.

Referring to FIG. 13B, it may be determined whether the level of the second voltage VZTC at the first temperature T1 is substantially the same as the level of the first voltage VNTC at the first temperature T1 (step S121). When the level of the second voltage VZTC at the first temperature T1 is different from the level of the first voltage VNTC at the first temperature T1 (step S121: NO), at least one selected from the level of the first voltage VNTC and the level of the second voltage VZTC may be changed (step S125), and then the step S121 may be repeated. When the level of the second voltage VZTC at the first temperature T1 is substantially the same as the level of the first voltage VNTC at the first temperature T1 (step S121: YES), the first trim operation may be completed. The example of FIG. 13B may be employed to perform the first trim operation based on one of the graph of FIG. 2A, the graph of FIG. 10A and the graph of FIG. 10B.

Figure 14:
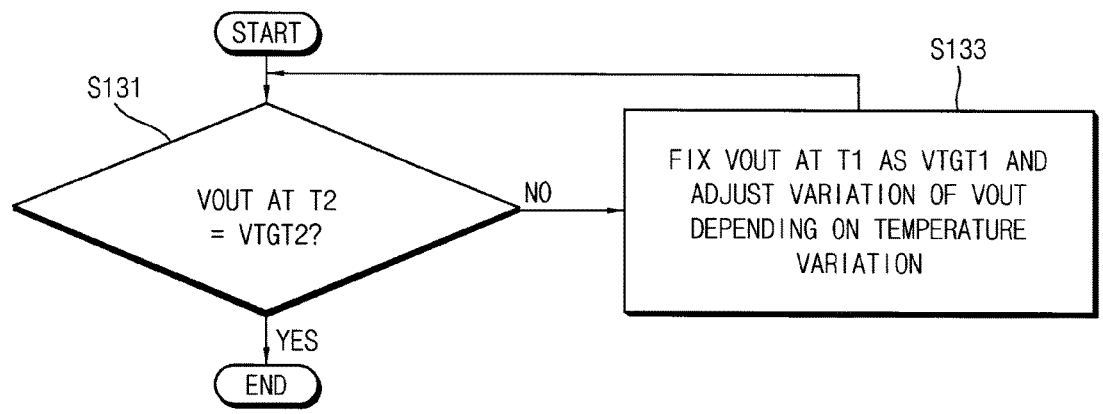
FIG. 14 is a flow chart illustrating an example of performing a second trim operation in FIG. 12, according to example embodiments of the inventive concept.

FIG. 14 is a flow chart illustrating an example of performing a second trim operation (S130) shown in FIG. 12, according to example embodiments of the inventive concept.

Referring to FIG. 14, it may be determined whether the level of the output voltage VOUT is set to the second target level VTGT2 at the second temperature T2 (step S131). When the level of the output voltage VOUT is not set to the second target level VTGT2 (step S131: NO), the level of the output voltage VOUT at the first temperature T1 may be fixed as the first target level VTGT1 and the variation (e.g., the slope) of the output voltage VOUT depending on the temperature variation may be adjusted (step S133), and then the step S131 may be repeated. When the level of the output voltage VOUT is set to the second target level VTGT2 (step S131: YES), the second trim operation may be completed. In some example embodiments, the final value of the second control signal CS2 may be stored after the second trim operation is completed.

Figure 15:
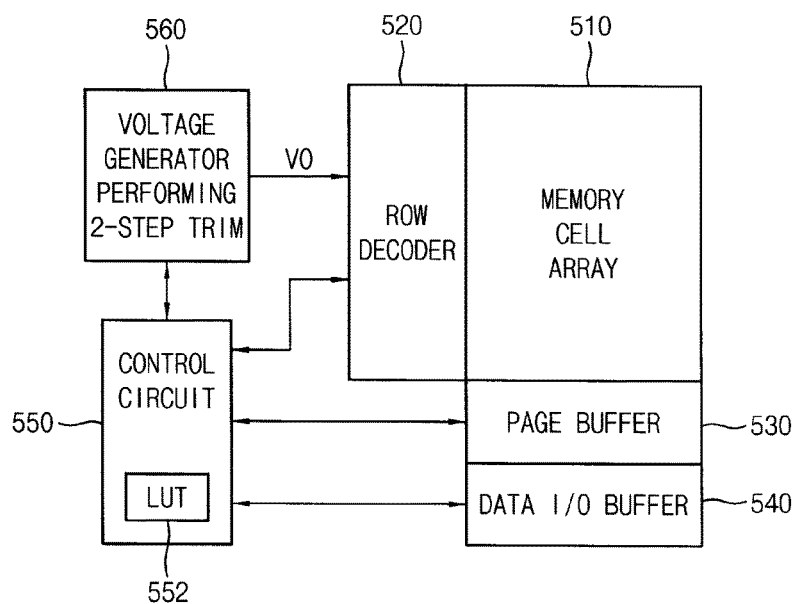
FIG. 15 is a block diagram illustrating a semiconductor memory device according to example embodiments of the inventive concept.

FIG. 15 is a block diagram illustrating a semiconductor memory device according to example embodiments of the inventive concept.

Referring to FIG. 15, semiconductor memory device 500 includes a memory cell array 510, a row decoder 520, a page buffer 530, a data input/output (I/O) buffer 540, a control circuit 550 and a voltage generator 560.

In some example embodiments, the semiconductor memory device 500 may be implemented using any nonvolatile memory device, e.g., a flash memory device, a phase random access memory (PRAM) device, a ferroelectric random access memory (FRAM) device, a resistive random access memory (RRAM) device, a magnetic random access memory (MRAM) device, or the like.

The memory cell array 510 includes a plurality of memory cells that store data and operates based on a memory cell operating voltage VO. Each of the plurality of memory cells may be connected to a respective one of a plurality of wordlines and a respective one of a plurality of bitlines. For example, the plurality of memory cells may be nonvolatile memory cells. As will be described below with reference to FIGS. 16A, 16B and 16C, the plurality of memory cells may be NAND or NOR flash memory cells, and may be arranged in a two dimensional (2-D) array structure or a three dimensional (3-D) vertical array structure.

The row decoder 520 may be connected to the plurality of wordlines, and may select at least one of the plurality of wordlines in response to a row address.

The page buffer 530 may be connected to the plurality of bitlines, and may store write data to be programmed into the memory cell array 510 or read data that are sensed from the memory cell array 510. In other words, the page buffer 530 may operate as a write driver or a sensing amplifier according to an operation mode of the semiconductor memory device 500. For example, the page buffer 530 may operate as the write driver in a program mode, in which a data write operation is performed, and may operate as the sensing amplifier in a read mode, in which a data read operation is performed.

The data I/O buffer 540 may provide the write data, which is received from outside of the semiconductor memory device 500 (e.g., from an external memory controller), to the memory cell array 510 through the page buffer 530. The data I/O buffer 540 may provide the read data, which is output from the memory cell array 510 through the page buffer 530, to the outside of the semiconductor memory device 500 (e.g., to the external memory controller).

The control circuit 550 may control the row decoder 520, the page buffer 530, the data I/O buffer 540 and the voltage generator 560 to perform a data read operation, a data write operation and/or a data erase operation for the memory cell array 510.

The voltage generator 560 generates the memory cell operating voltage VO based on a power supply voltage. The voltage generator 560 may be one of the voltage generator 100 of FIG. 1 and the voltage generator 100a of FIG. 11. For example, the voltage generator 560 may perform a two-step trim operation (e.g., the first and second trim operations). The voltage generator 560 may set the first target level of the memory cell operating voltage VO at the first temperature based on the first trim operation, and may set the second target level of the memory cell operating voltage VO at the second temperature based on the second trim operation by fixing the first target level of the memory cell operating voltage VO at the first temperature and by adjusting the variation of the memory cell operating voltage VO depending on the temperature variation. After the first and second trim operations are completed, the voltage generator 560 may effectively generate the memory cell operating voltage VO that has the target level corresponding to the present operating temperature based on the final values of the first and second control signals for controlling the first and second trim operations. Accordingly, the semiconductor memory device 500 including the voltage generator 560 may have a relatively improved performance.

In some example embodiments, the memory cell operating voltage VO may correspond to a read voltage applied to the nonvolatile memory cells, and a level of the read voltage may be selectively changed based on the number of program/erase operations for the nonvolatile memory cells. For example, when the number of the program/erase operations is greater than a reference number after the first and second trim operations are completed, the final value of the second control signal for controlling the second trim operation may be changed based on a predetermined lookup table 552. The lookup table 552 may be included in the control circuit 550 and may have information about variation of the read voltage depending on the number of the program/erase operations. As another example, when the number of the program/erase operations is greater than a reference number after the first and second trim operations are completed, the final value of the second control signal for controlling the second trim operation may be changed by re-performing the first and second trim operations.

Figure 16A:
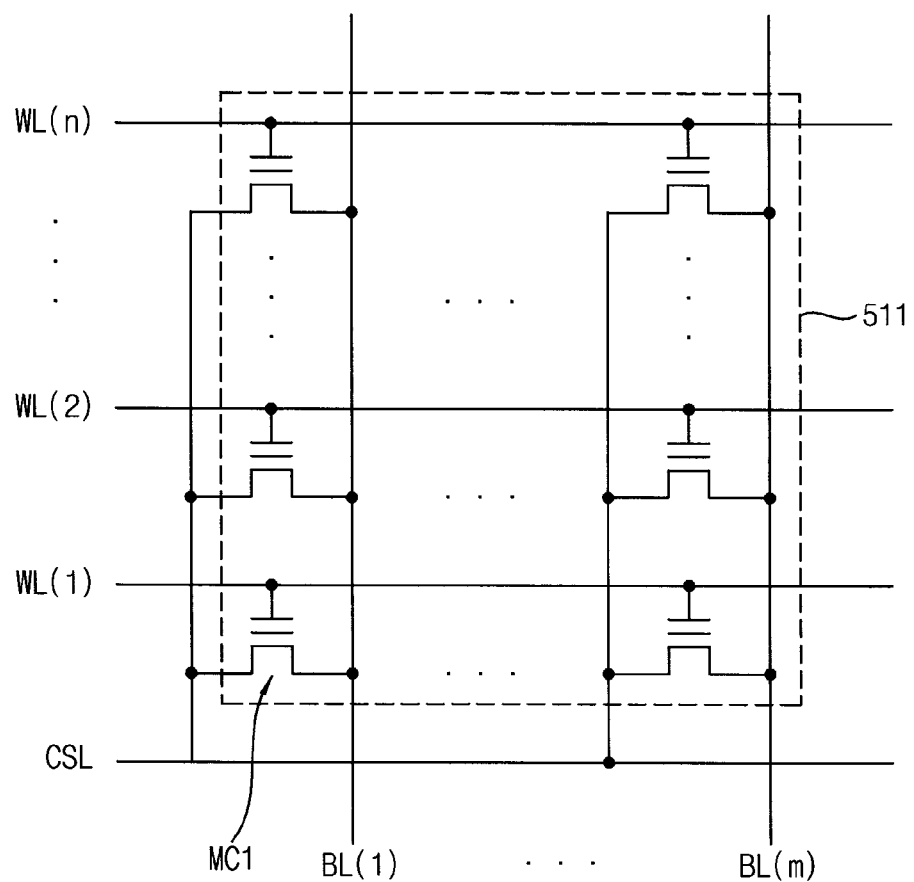
FIGS. 16A, 16B and 16C are diagrams illustrating examples of a memory cell array included in the semiconductor memory device shown in FIG. 15.
Figure 16B:
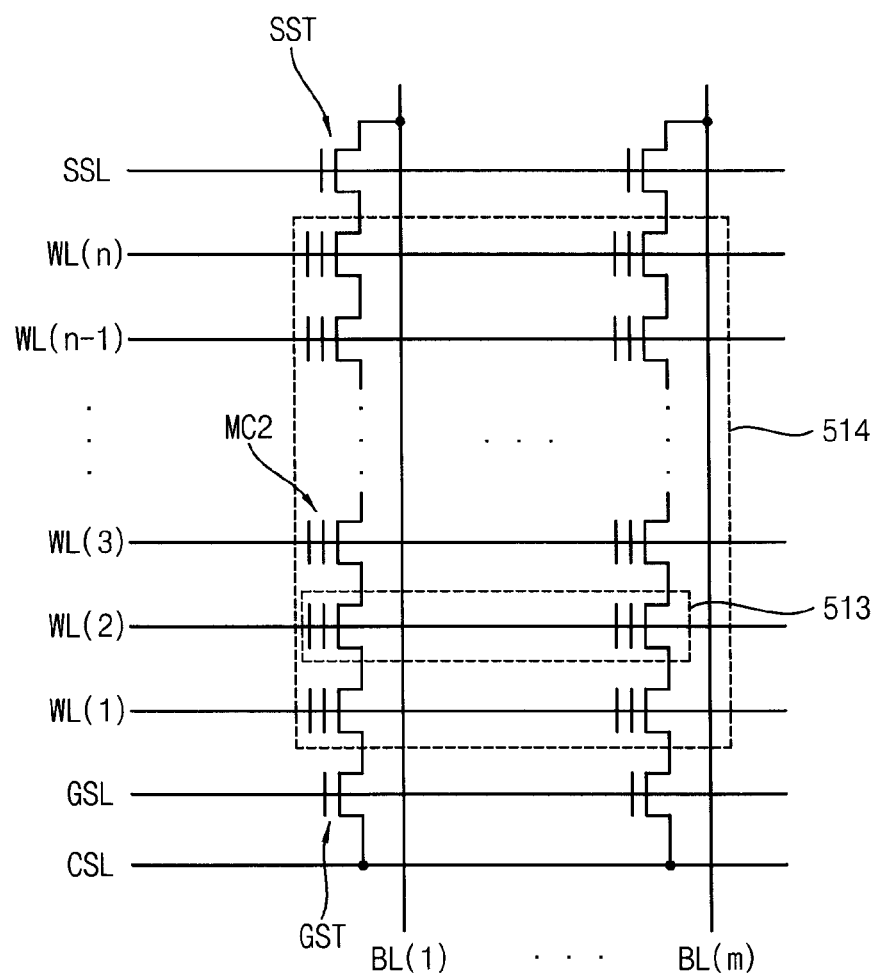
Figure 16C:
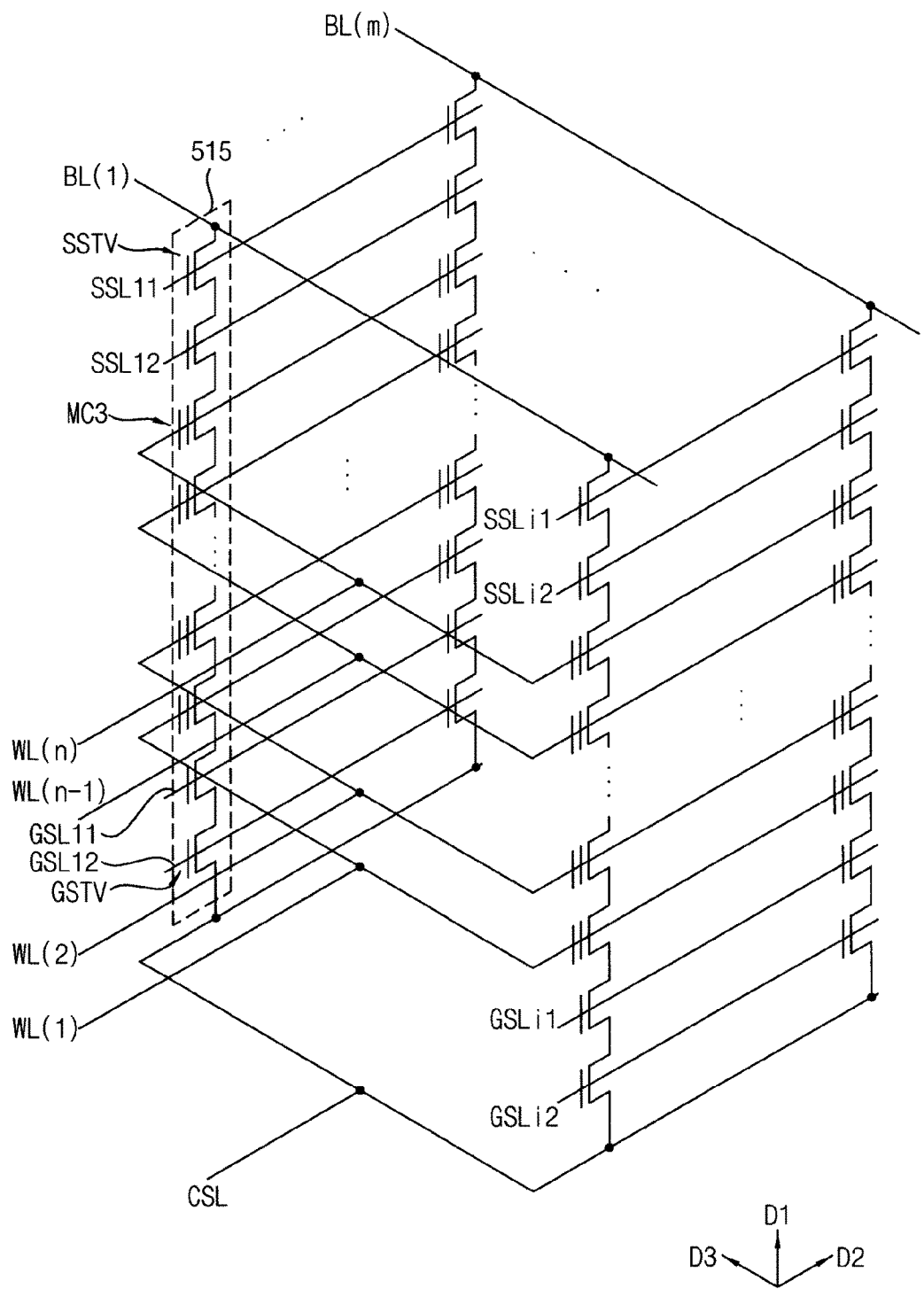

FIGS. 16A, 16B and 16C are diagrams illustrating examples of a memory cell array included in the semiconductor memory device shown in FIG. 15.

FIG. 16A is a circuit diagram illustrating an example of a memory cell array included in a NOR flash memory device. FIG. 16B is a circuit diagram illustrating an example of a memory cell array included in a NAND flash memory device. FIG. 16C is a circuit diagram illustrating an example of a memory cell array included in a vertical flash memory device.

Referring to FIG. 16A, a memory cell array 510a may include a plurality of memory cells MC1. The memory cells arranged in the same row may be disposed in parallel between one of bitlines BL(1), . . . , BL(m) and a common source line CSL, and may be connected in common to one of wordlines WL(1), WL(2), . . . , WL(n). For example, the memory cells arranged in a first row may be disposed in parallel between a first bitline BL(1) and the common source line CSL. Gate electrodes of the memory cells arranged in the first column may be coupled in common to a first wordline WL(1). The memory cells MC1 may be controlled according to levels of voltages applied to the wordlines WL(1), . . . , WL(n). The NOR flash memory device including the memory cell array 510a may perform write and read operations in units of byte or word, and may perform an erase operation in units of block 511.

Referring to FIG. 16B, a memory cell array 510b may include string selection transistors SST, ground selection transistors GST and memory cells MC2. The string selection transistors SST may be connected to bitlines BL(1), . . . , BL(m), and the ground selection transistors GST may be connected to a common source line CSL. The memory cells arranged in the same row may be disposed in series between one of the bitlines BL(1), . . . , BL(m) and the common source line CSL, and the memory cells arranged in the same column may be connected in common to one of wordlines WL(1), WL(2), WL(3), . . . , WL(n-1), WL(n). In other words, the memory cells MC2 may be connected in series between the string selection transistors SST and the ground selection transistors GST, and the 16, 32 or 64 wordlines may be disposed between a string selection line SSL and a ground selection line GSL.

The string selection transistors SST are connected to the string selection line SSL such that the string selection transistors SST may be controlled according to a level of a voltage applied from the string selection line SSL. The memory cells MC2 may be controlled according to levels of voltages applied to the wordlines WL(1), . . . , WL(n).

The NAND flash memory device including the memory cell array 510b may perform the data read and write operations in units of page 513 and the data erase operation in units of block 514. In some example embodiments, each of page buffers may be connected to even and odd bitlines one by one. In this case, the even bitlines form an even page, the odd bitlines form an odd page, and the data write operation for the memory cells MC2 of the even and odd pages may be performed by turns and sequentially.

Referring to FIG. 16C, a memory cell array 510c may include a plurality of strings 515 having a vertical structure. The plurality of strings 515 may be formed in a second direction D2 such that a string row may be formed. A plurality of string rows may be formed in a third direction D3 such that a string array may be formed. Each of the strings 515 may include ground selection transistors GSTV, memory cells MC3 and string selection transistors SSTV which are disposed in series in a first direction D1 between bitlines BL(1), . . . , BL(m) and a common source line CSL.

The ground selection transistors GSTV may be connected to ground selection lines GSL11, GSL12, . . . , GSLi1, GSLi2, respectively, and the string selection transistors SSTV may be connected to string selection lines SSL11, SSL12, . . . , SSLi1, SSLi2, respectively. The memory cells arranged on the same layer may be connected in common to one of wordlines WL(1), WL(2), . . . , WL(n-1), WL(n). The ground selection lines GSL11, . . . , GSLi2 and the string selection lines SSL11, . . . , SSLi2 may extend in the second direction D2 and may be formed along the third direction D3. The wordlines WL(1), . . . , WL(n) may extend in the second direction D2 and may be formed along the first and third directions D1 and D3. The bitlines BL(1), . . . , BL(m) may extend in the third direction D3 and may be formed along the second direction D2. The memory cells MC3 may be controlled according to levels of voltages applied to the wordlines WL(1), . . . , WL(n).

Since the vertical flash memory device including the memory cell array 510c includes NAND flash memory cells, similarly to the NAND flash memory device of FIG. 16B, the vertical flash memory device performs the data read and write operations in units of page and the data erase operation in units of block.

In some example embodiments, it may be implemented that two string selection transistors included in one string 515 are connected to one string selection line, and two ground selection transistors included in one string are connected to one ground selection line. In other example embodiments, it may be implemented that one string 515 includes one string selection transistor and one ground selection transistor.

Figure 17:
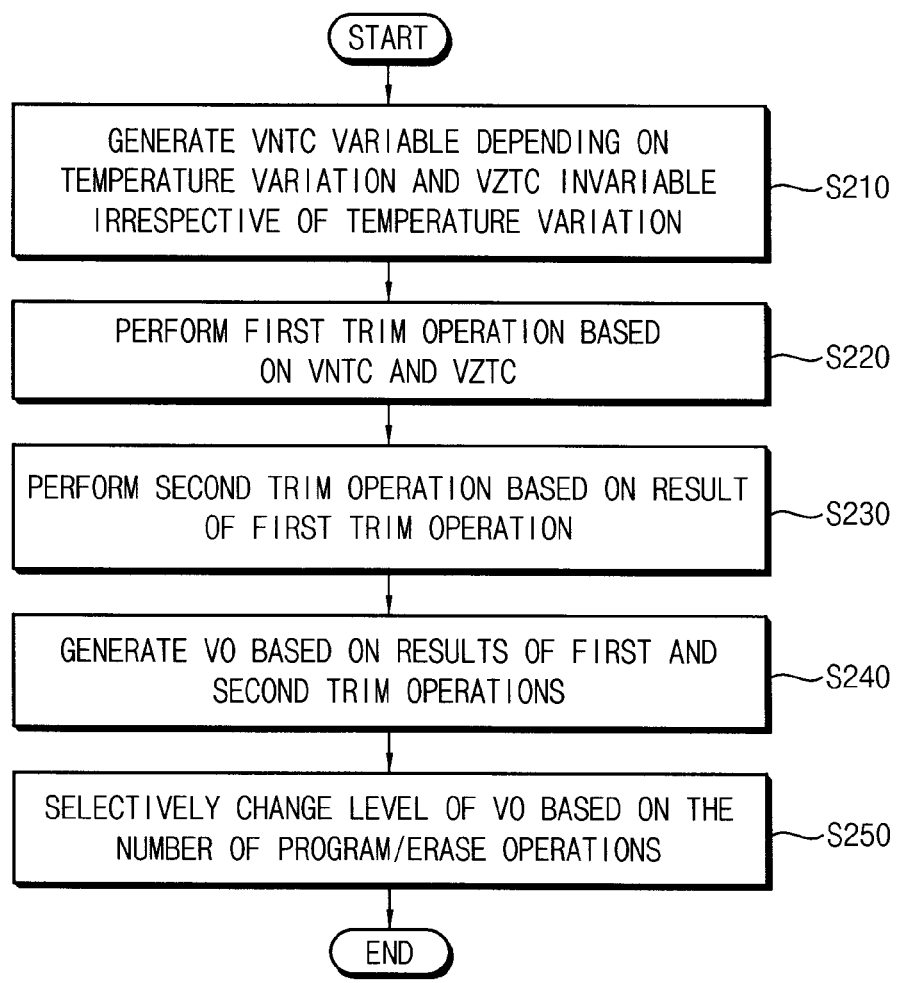
FIG. 17 is a flow chart descriptive of an operation of a voltage generator included in the semiconductor memory device shown in FIG. 15, according to example embodiments of the inventive concept.

FIG. 17 is a flow chart descriptive of an operation of a voltage generator included in the semiconductor memory device shown in FIG. 15, according to example embodiments of the inventive concept.

Referring to FIGS. 1, 15 and 17, a first voltage VNTC and a second voltage VZTC are generated based on a power supply voltage VDD (step S210). A first trim operation is performed based on the first voltage VNTC and the second voltage VZTC (step S220). A second trim operation is performed based on a result of the first trim operation (step S230). A memory cell operating voltage VO is generated based on results of the first and second trim operations (step S240). The steps S210, S220, S230 and S240 in FIG. 17 may be substantially the same as the steps S110, S120, S130 and S140 in FIG. 12, respectively.

A level of the memory cell operating voltage VO is selectively changed based on the number of program/erase operations for a plurality of memory cells (e.g., nonvolatile memory cells) included in the memory cell array 510.

Figure 18A:
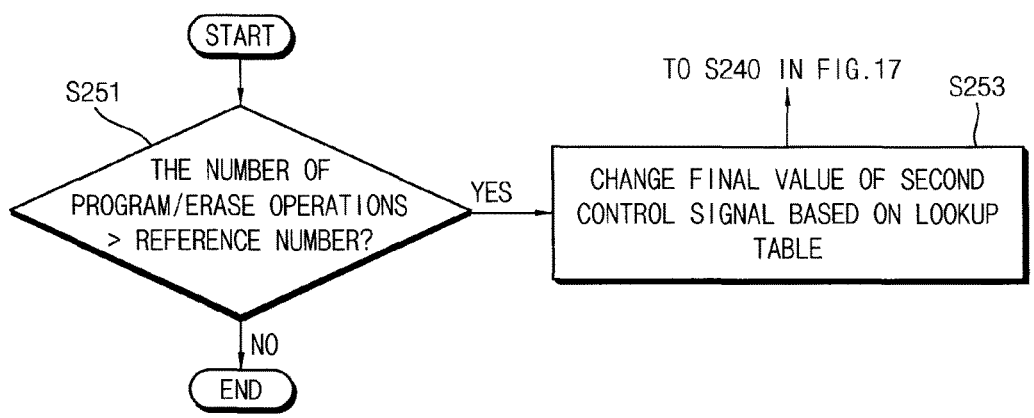
FIGS. 18A and 18B are flow charts illustrating examples of selectively changing a level of a memory cell operating voltage in FIG. 17, according to example embodiments of the inventive concept.
Figure 18B:
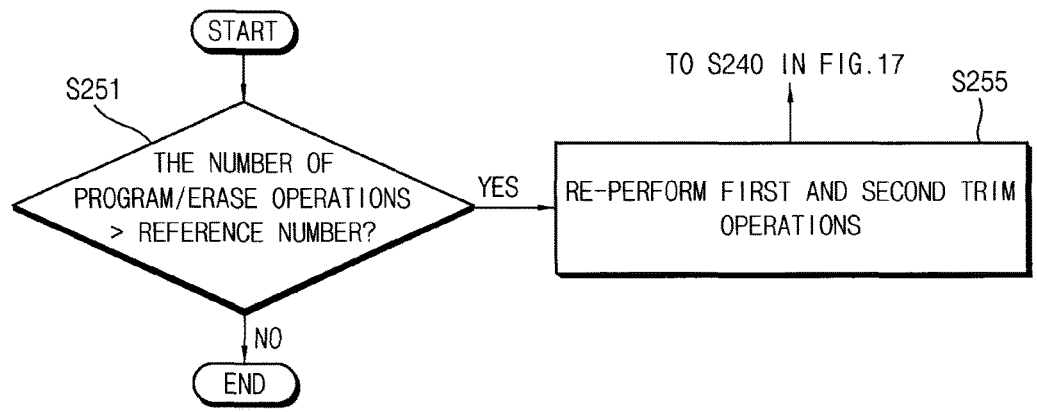

FIGS. 18A and 18B are flow charts illustrating examples of selectively changing a level of a memory cell operating voltage (S250) shown in FIG. 17, according to example embodiments of the inventive concept.

Referring to FIG. 18A, it may be determined whether the number of the program/erase operations is greater than a reference number (step S251). When the number of the program/erase operations is greater than a reference number (step S251: YES), the final value of the second control signal for controlling the second trim operation may be changed based on the lookup table 552 (step S253). The memory cell operating voltage VO may be generated based on the changed final value of the second control signal (step S240 in FIG. 17). When the number of the program/erase operations is equal to or smaller than the reference number (step S251: NO), the memory cell operating voltage VO may be maintained.

Referring to FIG. 18B, it may be determined whether the number of the program/erase operations is greater than a reference number (step S251). When the number of the program/erase operations is greater than a reference number (step S251: YES), the first and second trim operations may be re-performed (step S255). The memory cell operating voltage VO may be generated based on results of the re-performed first and second trim operations (step S240 in FIG. 17). When the number of the program/erase operations is equal to or smaller than the reference number (step S251: NO), the memory cell operating voltage VO may be maintained.

Figure 19:
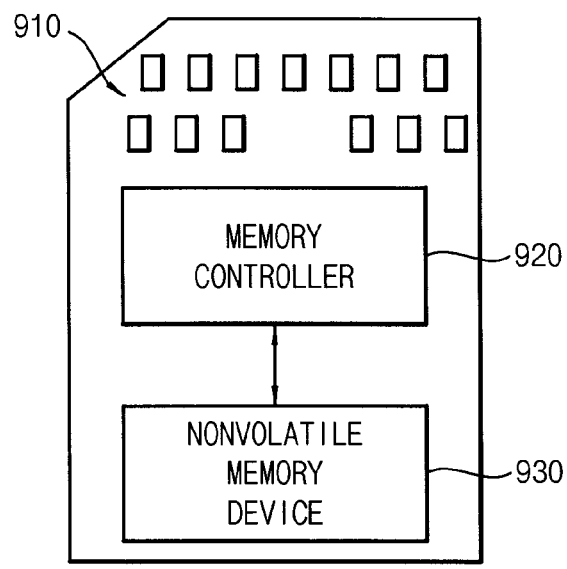
FIG. 19 is a diagram illustrating a memory card according to example embodiments of the inventive concept.

FIG. 19 is a diagram illustrating a memory card according to example embodiments of the inventive concept.

Referring to FIG. 19, a memory card 900 may include a plurality of connecting pins 910, a memory controller 920 and a semiconductor memory device 930.

The connecting pins 910 may be connected to a host (not illustrated) to transfer signals between the host and the memory card 900. The connecting pins 910 may include a clock pin, a command pin, a data pin and/or a reset pin.

The memory controller 920 may receive data from the host, and may store the received data in the semiconductor memory device 930. Although not illustrated in FIG. 19, the memory card 900 may further include at least one volatile memory device that temporarily stores data transferred between the host and the semiconductor memory device 930.

The semiconductor memory device 930 may be the semiconductor memory device 500 shown in FIG. 15 (e.g., a nonvolatile memory device). For example, the semiconductor memory device 930 may include a voltage generator that performs a two-step trim operation (e.g., the first and second trim operations). The voltage generator may set the first target level of the memory cell operating voltage VO at the first temperature based on the first trim operation, and may set the second target level of the memory cell operating voltage VO at the second temperature based on the second trim operation by fixing the first target level of the memory cell operating voltage VO at the first temperature and by adjusting the variation of the memory cell operating voltage VO depending on the temperature variation. After the first and second trim operations are completed, the voltage generator may effectively generate the memory cell operating voltage VO that has the target level corresponding to the present operating temperature based on the final values of the first and second control signals for controlling the first and second trim operations. Accordingly, the semiconductor memory device 930 including the voltage generator may have a relatively improved performance.

For example, the memory card 900 may include a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a universal serial bus (USB) card, a smart card, a compact flash (CF) card, or the like.

In some example embodiments, the memory card 900 may be attachable to the host, such as a desktop computer, a laptop computer, a tablet computer, a mobile phone, a smart phone, a music player, a personal digital assistants (PDA), a portable multimedia player (PMP), a digital television, a digital camera, a portable game console, or the like.

Figure 20:
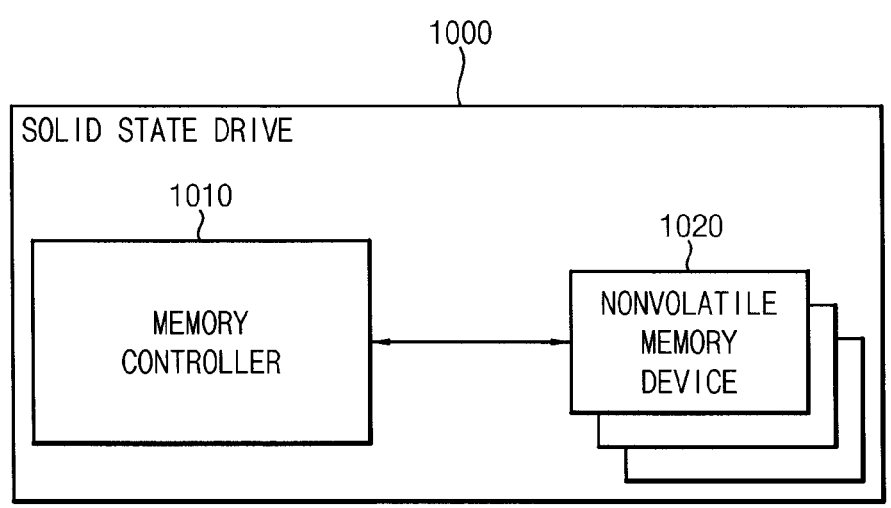
FIG. 20 is a diagram illustrating a solid state drive (SSD) according to example embodiments of the inventive concept.

FIG. 20 is a diagram illustrating a solid state drive (SSD) according to example embodiments of the inventive concept.

Referring to FIG. 20, a SSD 1000 includes a memory controller 1010 and a plurality of semiconductor memory devices 1020.

The memory controller 1010 may receive data from a host (not illustrated). The memory controller 1010 may store the received data in the plurality of semiconductor memory devices 1020. Although not illustrated in FIG. 20, the SSD 1000 may further include at least one volatile memory device that temporarily stores the received data.

Each of the semiconductor memory devices 1020 may be the semiconductor memory device 500 shown in FIG. 15 (e.g., a nonvolatile memory device). For example, each of the semiconductor memory devices 1020 may include a voltage generator that performs a two-step trim operation (e.g., the first and second trim operations). The voltage generator may set the first target level of the memory cell operating voltage VO at the first temperature based on the first trim operation, and may set the second target level of the memory cell operating voltage VO at the second temperature based on the second trim operation by fixing the first target level of the memory cell operating voltage VO at the first temperature and by adjusting the variation of the memory cell operating voltage VO depending on the temperature variation. After the first and second trim operations are completed, the voltage generator may effectively generate the memory cell operating voltage VO that has the target level corresponding to the present operating temperature based on the final values of the first and second control signals for controlling the first and second trim operations. Accordingly, the semiconductor memory devices 1020 including the voltage generator may have a relatively improved performance.

In some example embodiments, the SSD 1000 may be connected to the host, such as a mobile device, a mobile phone, a smart phone, a PDA, a PMP, a digital camera, a portable game console, a music player, a desktop computer, a notebook computer, a tablet computer, a speaker, a video, a digital television, or the like.

Figure 21:
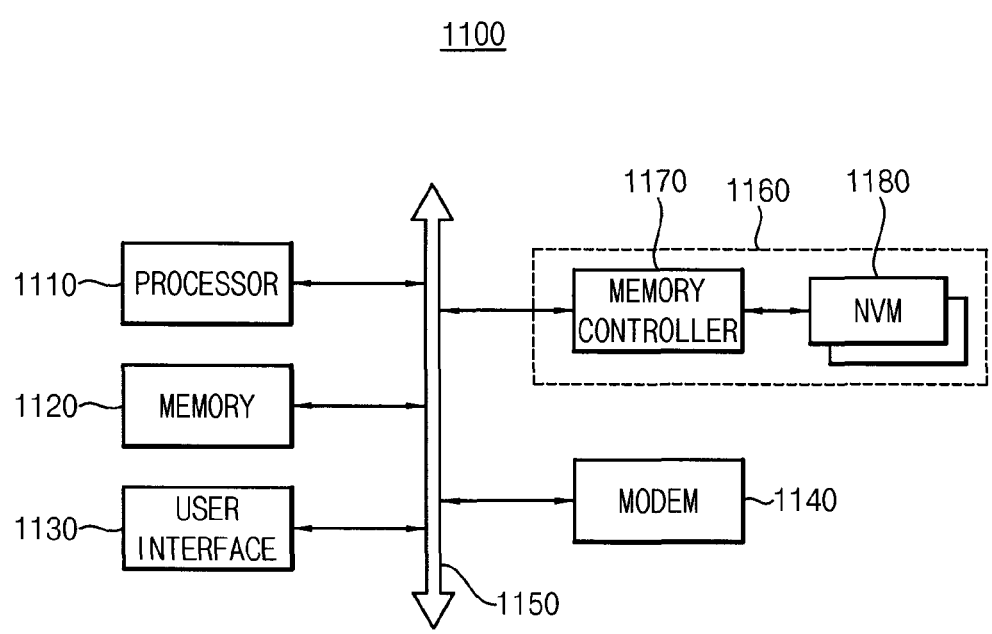
FIG. 21 is a diagram illustrating a computing system according to example embodiments of the inventive concept.

FIG. 21 is a diagram illustrating a computing system according to example embodiments of the inventive concept.

Referring to FIG. 21, a computing system 1100 includes a processor 1110, a memory device 1120, a user interface 1130, a bus 1150 and a memory system 1160. In some example embodiments, the computing system 1100 may further include a modem 1140, such as a baseband chipset.

The processor 1110 may perform specific calculations or tasks. For example, the processor 1110 may be a microprocessor, a central processing unit (CPU), a digital signal processor, or the like. The processor 1110 may be coupled to the memory device 1120 via a bus 1150, such as an address bus, a control bus and/or a data bus. For example, the memory device 1120 may be implemented by a DRAM, a mobile DRAM, a SRAM, a PRAM, a FRAM, a RRAM, a MRAM and/or a flash memory. Further, the processor 1110 may be connected to an extension bus, such as a peripheral component interconnect (PCI) bus, and may control the user interface 1130 including at least one input device, such as a keyboard, a mouse, a touch screen, or the like, and at least one output device, a printer, a display device, or the like. The modem 1140 may perform wired or wireless communication with an external device.

Semiconductor memory devices 1180 in the memory system 1160 may be controlled by a memory controller 1170 to store data processed by the processor 1110 or data received via the modem 1140. Each of the semiconductor memory devices 1180 may be the semiconductor memory device 500 shown in FIG. 15 (e.g., a nonvolatile memory device), and may include a voltage generator that performs a two-step trim operation (e.g., the first and second trim operations). Accordingly, the semiconductor memory devices 1180 including the voltage generator may have a relatively improved performance.

In some example embodiments, the computing system 1100 may further include a power supply, an application chipset, a camera image processor (CIS), among other components.

In an embodiment of the present inventive concept, a three-dimensional (3D) memory array may be provided in the semiconductor memory device 500 of FIG. 15, the semiconductor memory device 930 in FIG. 19, the semiconductor memory devices 1020 in FIG. 20 and/or the semiconductor memory devices 1180 in FIG. 21. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The above described embodiments may be used in a semiconductor memory device or system including the semiconductor memory device, such as a mobile phone, a smart phone, a personal digital assistant (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A voltage generator comprising:
  a first trim unit configured to generate a first voltage and a second voltage based on a power supply voltage, and configured to perform a first trim operation by changing a level of the second voltage, the first voltage being variable depending on a temperature variation, the second voltage being invariable irrespective of the temperature variation, the level of the second voltage at a first temperature becoming substantially the same as a level of the first voltage at the first temperature based on the first trim operation; and
  a second trim unit configured to generate an output voltage based on the power supply voltage, the first voltage, the second voltage, a reference voltage and a feedback voltage and configured to perform a second trim operation by adjusting a variation of the output voltage depending on the temperature variation based on a result of the first trim operation, the feedback voltage being adjusted based on the output voltage
  wherein the second trim unit comprises
  a first comparison unit configured to compare the reference voltage with the feedback voltage, a second comparison unit configured to compare the first voltage with the second voltage, an output voltage generation unit connected to the first and second comparison units via first and second nodes, and configured to amplify a voltage at the first node to generate the output voltage, and a feedback unit configured to receive the output voltage, and configured to adjust the feedback voltage based on the output voltage, wherein the variation of the output voltage depending on the temperature variation is adjusted by changing at least one of a first current and a second current based on a first control signal, the first current flowing through the first comparison unit and the second current flowing through the second comparison unit.

2. The voltage generator of claim 1, wherein a first level of the output voltage at the first temperature is set to a first target level when the first trim operation is completed, and a second level of the output voltage at a second temperature is set to a second target level when the second trim operation is completed.

3. The voltage generator of claim 2, wherein the second level of the output voltage is set to the second target level by fixing the first level of the output voltage as the first target level and by adjusting the variation of the output voltage depending on the temperature variation.

4. The voltage generator of claim 1, wherein the first trim unit comprises:

a first voltage generation unit configured to generate the first voltage based on the power supply voltage and a ground voltage; and a second voltage generation unit configured to generate the second voltage based on the power supply voltage and the ground voltage, and configured to change the level of the second voltage based on a second control signal.

5. The voltage generator of claim 4, wherein the first voltage generation unit comprises:

a first p-type metal oxide semiconductor (PMOS) transistor having a first electrode connected to the power supply voltage, a control electrode connected to the ground voltage, and a second electrode;

a second PMOS transistor having a first electrode connected to the second electrode of the first PMOS transistor, a control electrode connected to the ground voltage, and a second electrode connected to a third node; and third and fourth PMOS transistors connected in parallel between the third node and the ground voltage, each of the third and fourth PMOS transistors having a control electrode connected to the ground voltage, wherein the first voltage is output from the third node.

6. The voltage generator of claim 4, wherein the second voltage generation unit comprises:

a first resistor connected between the power supply voltage and a third node; and a second resistor connected between the third node and the ground voltage, wherein the second voltage is output from the third node, and at least one of a resistance of the first resistor and a resistance of the second resistor is variable based on the second control signal.

7. The voltage generator of claim 1, wherein the first comparison unit comprises:

a first n-type metal oxide semiconductor (NMOS) transistor connected between the first node and a third node, the first NMOS transistor having a control electrode connected to the reference voltage;

a second NMOS transistor connected between the second node and the third node, the second NMOS transistor having a control electrode connected to the feedback voltage; and a first current source connected between the third node and a ground voltage.

8. The voltage generator of claim 7, wherein the second comparison unit comprises:

a third NMOS transistor connected between the first node and a fourth node, the third NMOS transistor having a control electrode connected to the first voltage;

a fourth NMOS transistor connected between the second node and the fourth node, the fourth NMOS transistor having a control electrode connected to the second voltage; and a second current source connected between the fourth node and the ground voltage.

9. The voltage generator of claim 8, wherein the second current source comprises:

a plurality of power switches connected in parallel between the fourth node and the ground voltage, each of the plurality of power switches being selectively turned on in response to the first control signal.

10. The voltage generator of claim 8, wherein the output voltage generation unit comprises:

a first PMOS transistor connected between the power supply voltage and the first node, the first PMOS transistor having a control electrode connected to the second node;

a second PMOS transistor connected between the power supply voltage and the second node, the second PMOS transistor having a control electrode connected to the second node; and an amplifier having an input electrode connected to the first node and an output electrode providing the output voltage.

11. The voltage generator of claim 1, wherein the variation of the output voltage depending on the temperature variation increases as the second current increases.

12. The voltage generator of claim 1, further comprising:

a control unit configured to generate a second control signal for the first trim operation based on the first voltage and the second voltage, and configured to generate the first control signal for the second trim operation based on the output voltage.

13. The voltage generator of claim 12, wherein the control unit comprises:

a storage unit configured to store a final value of the second control signal when the first trim operation is completed, and configured to store a final value of the first control signal when the second trim operation is completed.

14. A semiconductor memory device comprising:

a memory cell array including a plurality of memory cells, the memory cell array configured to operate based on a memory cell operating voltage; and a voltage generator configured to generate the memory cell operating voltage based on a power supply voltage, the voltage generator comprising a first trim unit configured to generate a first voltage and a second voltage based on the power supply voltage, and configured to perform a first trim operation by changing a level of the second voltage, the first voltage being variable depending on a temperature variation, the second voltage being invariable irrespective of the temperature variation, the level of the second voltage at a first temperature becoming substantially the same as a level of the first voltage at the first temperature based on the first trim operation, and a second trim unit configured to generate the memory cell operating voltage based on the power supply voltage, the first voltage, the second voltage, a reference voltage and a feedback voltage, and configured to perform a second trim operation by adjusting a variation of the memory cell operating voltage depending on the temperature variation based on a result of the first trim operation, the feedback voltage being adjusted based on the memory cell operating voltage wherein the memory cells are nonvolatile memory cells and the memory cell operating voltage comprises a read voltage, and the voltage generator is further configured to perform the first and second trim operations again when a number of program/erase operations performed on the nonvolatile memory cells is greater than a reference number of program/erase operations.

15. The semiconductor memory device of claim 14, wherein the memory cell array includes a three-dimensional memory array in which word-lines and/or bit-lines are shared between levels.

* * * * *